United States Patent
Kang et al.

(10) Patent No.: US 9,831,457 B2
(45) Date of Patent: Nov. 28, 2017

(54) ORGANIC LIGHT EMITTING DIODE

(71) Applicant: LG DISPLAY CO., LTD., Seoul (KR)

(72) Inventors: Minsoo Kang, Daejeon (KR); Jeoung Kwen No, Daejeon (KR); Mun Kyu Joo, Daejeon (KR); Yun Hye Hahm, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 526 days.

(21) Appl. No.: 14/404,596

(22) PCT Filed: May 31, 2013

(86) PCT No.: PCT/KR2013/004787
§ 371 (c)(1),
(2) Date: Nov. 28, 2014

(87) PCT Pub. No.: WO2013/180503
PCT Pub. Date: Dec. 5, 2013

(65) Prior Publication Data
US 2015/0144897 A1 May 28, 2015

(30) Foreign Application Priority Data
May 31, 2012 (KR) .................. 10-2012-0058232

(51) Int. Cl.
*H01L 51/50* (2006.01)
*H01L 51/52* (2006.01)
(Continued)

(52) U.S. Cl.
CPC .......... *H01L 51/504* (2013.01); *H01L 51/508* (2013.01); *H01L 51/5044* (2013.01);
(Continued)

(58) Field of Classification Search
CPC ........... H01L 2251/552; H01L 51/0052; H01L 51/0058; H01L 51/0072; H01L 51/5004;
(Continued)

(56) References Cited

U.S. PATENT DOCUMENTS

2005/0084713 A1 4/2005 Kido et al.
2005/0173700 A1 8/2005 Liao et al.
(Continued)

FOREIGN PATENT DOCUMENTS

CN 101032041 A 9/2007
CN 101447555 A 6/2009
(Continued)

OTHER PUBLICATIONS

Japanese Office Action with English translation dated Oct. 26, 2015 in Japanese Application No. 2015-514907 (12 pages total).
(Continued)

*Primary Examiner* — Dawn Garrett
(74) *Attorney, Agent, or Firm* — Dentons US LLP

(57) ABSTRACT

The present disclosure provides an organic light emitting device that includes a first electrode, a second electrode, and two or more light emitting units provided between the first electrode and the second electrode, wherein a charge generation layer is provided between, among the light emitting units, two light emitting units that are adjacent to each other, an electron transport layer is provided between the charge generation layer and the light emitting unit placed closer to the first electrode of the two adjacent light emitting units, and the electron transport layer includes a first electron transport layer doped with an n-type dopant, and a second electron transport layer doped with a metal salt, metal oxide or organic metal salt.

34 Claims, 5 Drawing Sheets

(51) Int. Cl.
*H05B 33/14* (2006.01)
*H01L 51/00* (2006.01)

(52) U.S. Cl.
CPC ...... *H01L 51/5076* (2013.01); *H01L 51/5206* (2013.01); *H01L 51/5221* (2013.01); *H01L 51/5278* (2013.01); *H05B 33/14* (2013.01); *H01L 51/0052* (2013.01); *H01L 51/0058* (2013.01); *H01L 51/0072* (2013.01); *H01L 51/5004* (2013.01); *H01L 51/5268* (2013.01); *H01L 2251/552* (2013.01)

(58) Field of Classification Search
CPC ............... H01L 51/504; H01L 51/5044; H01L 51/5076; H01L 51/508; H01L 51/5206; H01L 51/5221; H01L 51/5268; H01L 51/5278; H05B 33/14
See application file for complete search history.

(56) References Cited

U.S. PATENT DOCUMENTS

| | | |
|---|---|---|
| 2007/0159082 A1 | 7/2007 | Ikeda et al. |
| 2010/0253209 A1 | 10/2010 | Spindler et al. |
| 2010/0288362 A1 | 11/2010 | Hatwar et al. |
| 2010/0301316 A1 | 12/2010 | Nowatari et al. |
| 2010/0301317 A1 | 12/2010 | Nowatari et al. |
| 2011/0079774 A1 | 4/2011 | Kang et al. |
| 2011/0180792 A1 | 7/2011 | Lee et al. |
| 2011/0315968 A1 | 12/2011 | Nowatari et al. |
| 2012/0007071 A1 | 1/2012 | Joo et al. |
| 2012/0018707 A1 | 1/2012 | Lee et al. |
| 2012/0038876 A1 | 2/2012 | Lee et al. |

FOREIGN PATENT DOCUMENTS

| | | |
|---|---|---|
| EP | 2372807 A2 | 10/2011 |
| JP | 2005-123094 A | 5/2005 |
| JP | 2006-128660 A | 5/2006 |
| JP | 2007-523451 A | 8/2007 |
| JP | 2009-283787 A | 12/2009 |
| JP | 2010-27761 A | 2/2010 |
| JP | 2011-009727 A | 1/2011 |
| JP | 2011-521414 A | 7/2011 |
| JP | 2012-094301 A | 5/2012 |
| KR | 1020070027796 A | 3/2007 |
| KR | 10-2009-0119746 | 11/2009 |
| KR | 10-2010-037572 | 4/2010 |
| KR | 10-2010-0443994 | 4/2010 |
| KR | 10-2010-0105481 | 9/2010 |
| KR | 10-2012-0010438 | 2/2012 |
| KR | 20120016028 | 2/2012 |
| KR | 10-2012-0027157 | 3/2012 |
| KR | 20120027420 A | 3/2012 |
| TW | 201214756 A1 | 4/2012 |
| WO | 2010/132236 | 11/2010 |
| WO | 2011-105141 A1 | 9/2011 |

OTHER PUBLICATIONS

Taiwanese Office Action with English translation dated Oct. 22, 2105 in Taiwanese Application No. 102119492 (23 pages total).

[FIG. 1]
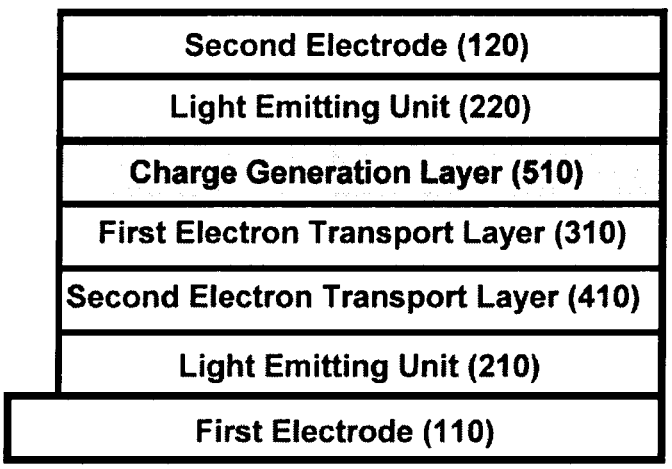
[FIG. 2]
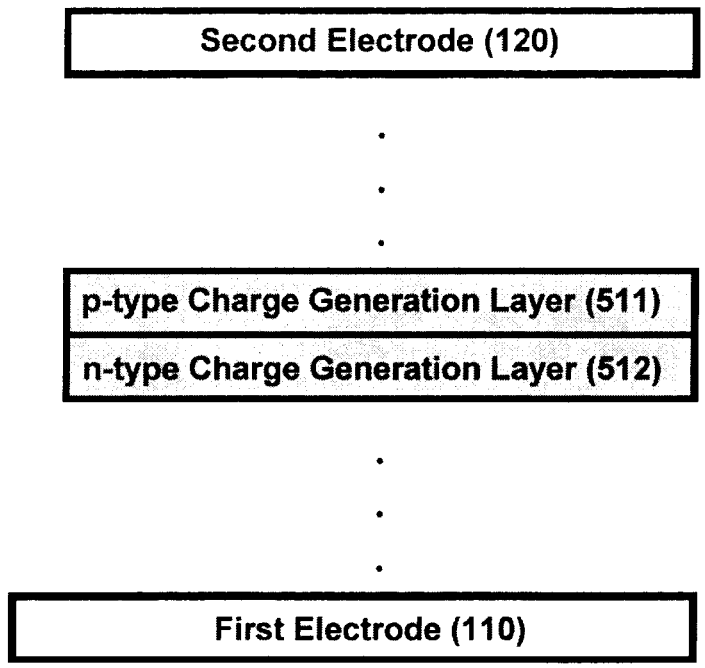

[FIG. 3]
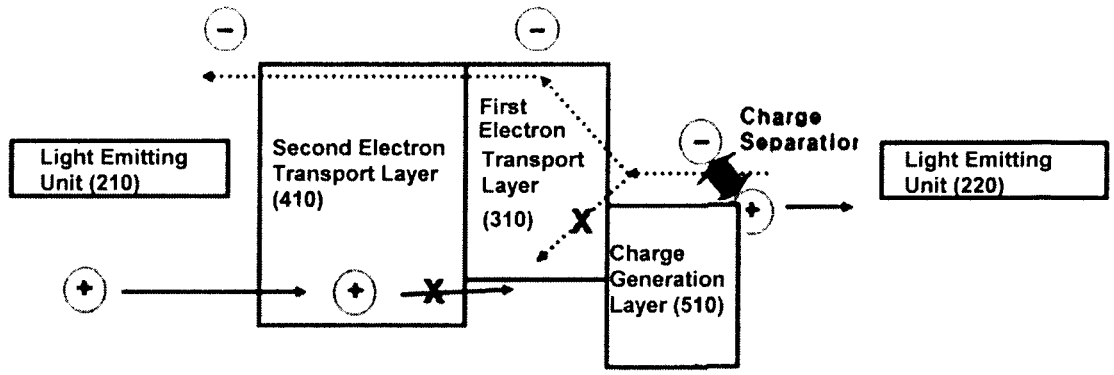
[FIG. 4]
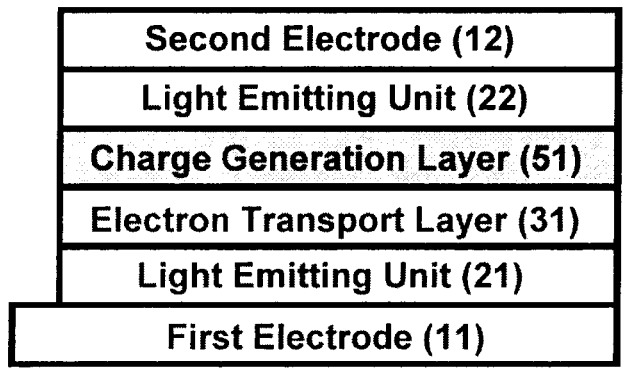
[FIG. 5]
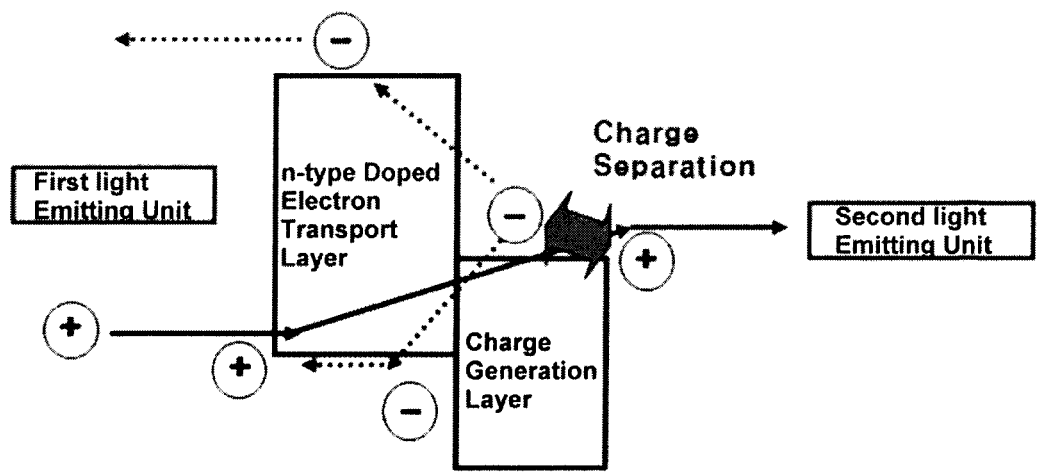

[FIG. 6]
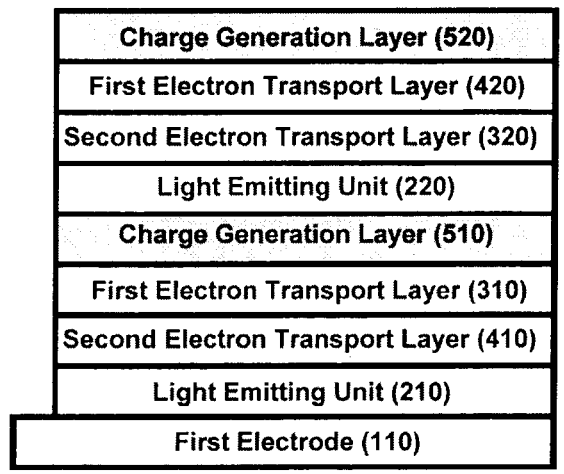
[FIG. 7]
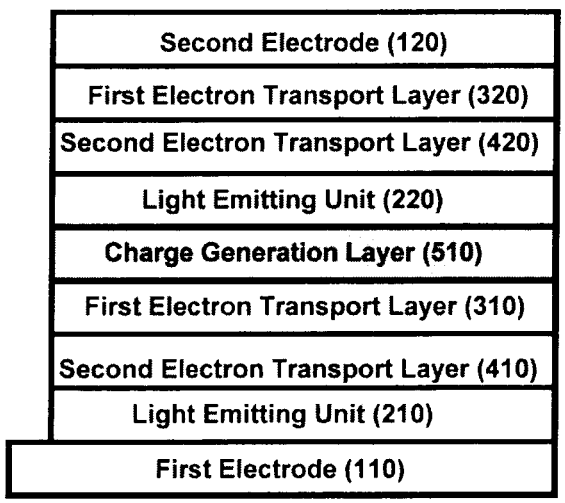

[FIG. 8]
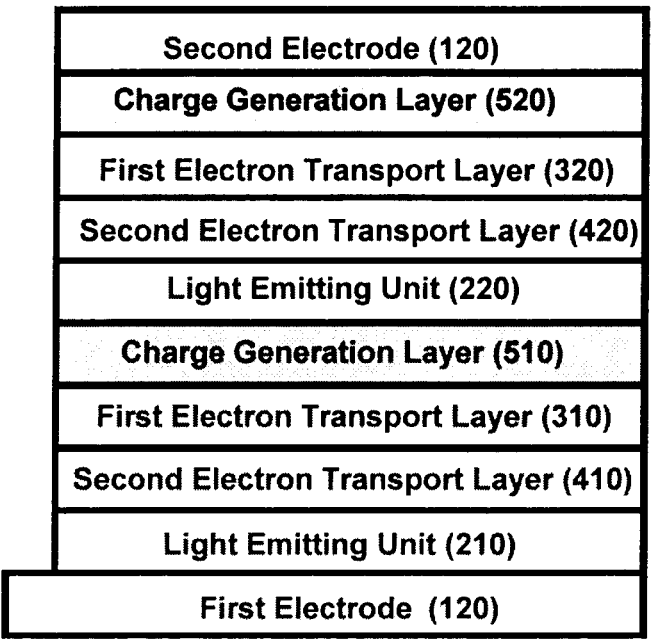
[FIG. 9]
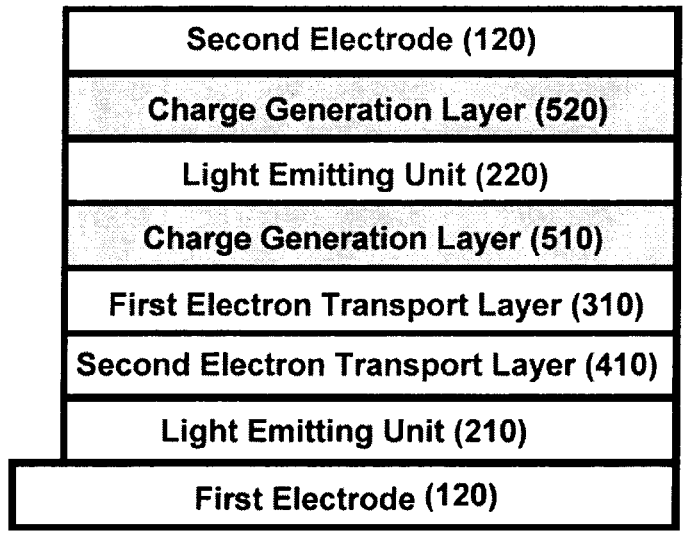

[FIG. 10]
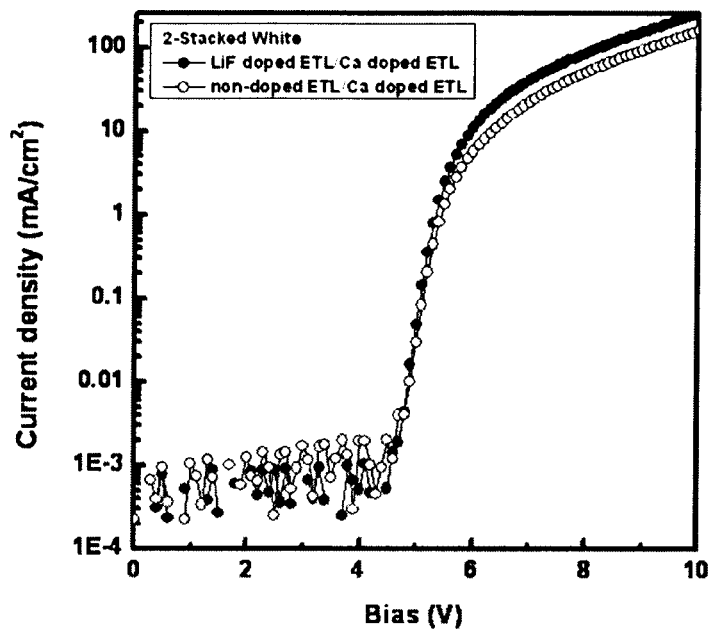
[FIG. 11]
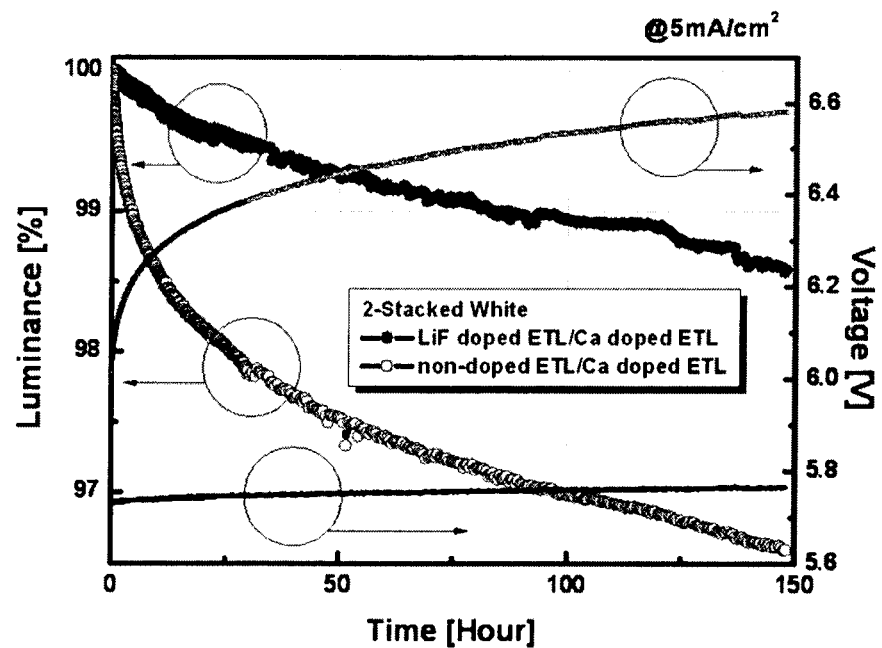

ORGANIC LIGHT EMITTING DIODE

This application is a National Stage Entry of International Application No. PCT/KR2013/004787, filed May 31, 2013, and claims the benefit of Korean Application No. 10-2012-0058232 filed on May 31, 2012, all of which are hereby incorporated by reference in their entirety for all purposes as if fully set forth herein.

TECHNICAL FIELD

The present disclosure relates to an organic light emitting device. More particularly, the present disclosure relates to an organic light emitting device that includes two or more light emitting units.

BACKGROUND ART

An organic light emitting device (OLED) is typically formed of two electrodes (an anode and a cathode), and one or more organic material layers placed between these electrodes. In the organic light emitting device having such a structure, when voltage is applied between the two electrodes, holes from the anode and electrons from the cathode flow into the organic material layer. The holes and the electrons are bonded to form excitons. The excitons fall back to the ground state and emit photons that correspond to the energy difference. By this principle, the organic light emitting device generates visible light. An information display device or an illumination device can be manufactured using the organic light emitting device.

Technologies to increase the efficiency of the organic light emitting device and lower the driving voltage have been continuously developed in order to widen the scope of application of the organic light emitting device and commercialize the organic light emitting device.

DISCLOSURE

Technical Problem

The present application describes an organic light emitting device that includes two or more light emitting units.

Technical Solution

An organic light emitting device according to one embodiment of the present disclosure includes a first electrode, a second electrode, and two or more light emitting units provided between the first electrode and the second electrode. Herein, a charge generation layer is provided between, among the light emitting units, two light emitting units that are adjacent to each other, an electron transport layer is provided between the charge generation layer and the light emitting unit placed closer to the first electrode of the two adjacent light emitting units, and the electron transport layer includes a first electron transport layer doped with an n-type dopant, and a second electron transport layer doped with a metal salt, metal oxide or organic metal salt.

In an organic light emitting device according to another embodiment of the present disclosure, an additional electron transport layer is provided between the second electrode and the light emitting unit adjacent to the second electrode, and the additional electron transport layer includes a first electron transport layer doped with an n-type dopant, and a second electron transport layer doped with a metal salt, metal oxide or organic metal salt.

In an organic light emitting device according to still another embodiment of the present disclosure, an additional electron transport layer is provided between the second electrode and the light emitting unit adjacent to the second electrode, and the additional electron transport layer includes a first electron transport layer doped with an n-type dopant, and a second electron transport layer doped with a metal salt, metal oxide or organic metal salt. In addition, an additional charge generation layer is provided between the second electrode and the additional electron transport layer.

Advantageous Effects

The embodiments according to the present disclosure can provide an organic light emitting device having significantly reduced driving voltage, excellent light emission efficiency, and a long lifespan, as well as having light emission efficiency that is improved compared with conventional organic light emitting devices.

DESCRIPTION OF DRAWINGS

FIG. 1 illustrates the layer structure of an organic light emitting device according to one embodiment of the present disclosure.

FIG. 2 illustrates the structure of a charge generation layer included in the organic light emitting device according to one embodiment of the present disclosure.

FIG. 3 is a diagram that schematically shows the flow of charges in the device shown by the diagram in FIG. 1.

FIG. 4 illustrates the layer structure of general organic light emitting devices.

FIG. 5 is a diagram that schematically shows the flow of charges in the device shown by the diagram in FIG. 4.

FIG. 6 illustrates the layer structure of an organic light emitting device according to other embodiments of the present disclosure.

FIG. 7 illustrates the layer structure of an organic light emitting device according to another embodiment of the present disclosure.

FIG. 8 illustrates the layer structure of an organic light emitting device according to still another embodiment of the present disclosure.

FIG. 9 illustrates the layer structure of an organic light emitting device according to still another embodiment of the present disclosure.

FIG. 10 illustrates a graph of voltage-current of a device in which the second electron transport layer was doped with a metal salt, and of a device in which the second electron transport layer was not doped.

FIG. 11 illustrates a graph of the usable life of a device in which the second electron transport layer was doped with a metal salt, and of a device in which the second electron transport layer was not doped.

MODE FOR DISCLOSURE

Hereinafter, the embodiments described in the present disclosure will be described in detail with reference to the drawings. In the following descriptions, the descriptions are made with reference to specific codes in the drawing, however, the embodiments of the present disclosure are not limited to the corresponding codes in the drawing, and related descriptions are all applied to the corresponding constitutions.

In the present disclosure, n-type means n-type semiconductor properties. In other words, n-type refers to properties such that electrons are received by injection or transported through the lowest unoccupied molecular orbital (LUMO) energy level, and can be defined as the properties of materials in which the mobility of electrons is greater than the mobility of holes. In contrast, p-type means p-type semiconductor properties. In other words, p-type refers to properties such that holes are received by injection or transported through the highest occupied molecular orbital (HOMO) energy level, and can be defined as the properties of materials in which the mobility of holes is greater than the mobility of electrons. In the present disclosure, a compound or an organic material layer having n-type properties is referred to as an n-type compound or an n-type organic material layer. In addition, a compound or an organic material layer having p-type properties is referred to as a p-type compound or a p-type organic material layer. In addition, n-type doping means being doped so as to have n-type properties.

FIG. 1 is a diagram that shows the layer structure of an organic light emitting device according to one embodiment of the present disclosure, and FIG. 3 shows the flow of charges in the organic light emitting device shown by the diagram in FIG. 1.

As shown by the diagram in FIG. 1, in the organic light emitting device according to one embodiment of the present disclosure, two light emitting units (210, 220) are placed between a first electrode (110) and a second electrode (120), and a charge generation layer (510) and an electron transport layer formed of two layers are placed between the two light emitting units (210, 220). At this time, the charge generation layer (510) is placed adjacent to the light emitting unit (220) adjacent to the second electrode (120), and the electron transport layer is placed adjacent to the light emitting unit (210) adjacent to the first electrode (110). The electron transport layer includes a first electron transport layer (310) doped with an n-type dopant and a second electron transport layer (410) doped with a metal salt, metal oxide or organic metal salt, the first electron transport layer (310) is placed adjacent to the charge generation layer (510), and the second electron transport layer (410) is placed adjacent to the light emitting unit (210) adjacent to the first electrode (110).

According to FIG. 1, the two light emitting units (210, 220) are provided between the first electrode (110) anal the second electrode (120). The charge generation layer (510) is provided between the two light emitting units (210, 220). The first electron transport layer (310) and the second electron transport layer (410) are provided between the charge generation layer (510) and the light emitting unit (210) placed closer to the first electrode among the light emitting units. The structure in which the light emitting unit (210), the second electron transport layer (410), the first electron transport layer (310), the charge generation layer (510), the light emitting unit (220) and the second electrode (120) are laminated on the first electrode (110) is shown by the diagram in FIG. 1, however, as an alternative, the structure in which the light emitting unit (220), the charge generation layer (510), the first electron transport layer (310), the second electron transport layer (410), the light emitting unit (210) and the first electrode (110) are laminated on the second electrode (120) is also included.

In the present disclosure, being adjacent means the relationship of disposition of the closest layers among the layers mentioned as being adjacent. For example, adjacent two light emitting units means the relationship of the two most closely disposed light emitting units among the many light emitting units. Being adjacent as described above may mean the case of two layers being physically adjoined, or other unmentioned layers may be disposed between the two layers. For example, the light emitting unit adjacent to the second electrode means the light emitting unit most closely disposed to the second electrode among the light emitting units. In addition, the second electrode and the light emitting unit may be physically adjoined, however, other layers besides the light emitting unit may be disposed between the second electrode and the light emitting unit. However, the charge generation layer is provided between two adjacent light emitting units.

In the present disclosure, the first electrode and the second electrode are for the application of outside voltage, and are not particularly limited as long as they have conductivity. For example, the first electrode may be an anode, and the second electrode may be a cathode.

In the present disclosure, the light emitting units (210, 220) are not particularly limited as long as they are units having the function of emitting light. For example, the light emitting units (210, 220) may include one or more light emitting layers. When necessary, the light emitting units (210, 220) may include one or more organic material layers other than the light emitting layers.

The light emitting layer in one example may include a material capable of emitting light in the visible region by bonding respectively transported holes and electrons. As the light emitting layer material, materials known in the art may be used. For example, materials having favorable quantum efficiency for fluorescence and phosphorescence may be used. Specific examples of the light emitting layer materials include an 8-hydroxy-quinoline aluminum complex ($Alq_3$); carbazole-based compounds; dimerized styryl compounds; BAlq; 10-hydroxybenzo quinoline-metal compounds; benzoxazole-, benzothiazole- and benzimidazole-based compounds; poly(p-phenylenevinylene) (PPV)-based polymers; Spiro compounds; polyfluorene; rubrene, and the like, but are not limited thereto.

In one example, the light emitting units (210, 220) may additionally provide and include one or more organic material layers other than the light emitting layers. The additional organic material layers may include a hole transport layer, a hole injection layer, a layer for transporting and injecting holes, a buffer layer, an electron blocking layer, an electron transport layer, an electron injection layer, a layer for transporting and injecting electrons, a hole blocking layer, and the like. Herein, the hole transport layer, the hole injection layer, the layer for transporting and injecting holes, or the electron blocking layer may be disposed closer to the first electrode (110) than the light emitting layer. The electron transport layer, the electron injection layer, the layer for transporting and injecting electrons, or the hole blocking layer may be disposed closer to the second electrode (120) than the light emitting layer. The use of the hole blocking layer may be determined depending on the properties of the light emitting layer. For example, when the properties of the light emitting layer are closer to n-type properties, the hole blocking layer may not be used, however, when the properties of the light emitting layer are closer to p-type properties, the use of the hole blocking layer may be considered. In addition, the use of the hole blocking layer may also be determined considering the relationship of the HOMO energy level of the light emitting layer with the HOMO energy level of the electron transport layer. When the HOMO energy level of the light emitting layer has a greater value than the HOMO energy level of the electron transport layer, the addition of the hole blocking layer may be considered. However, in this case, when the HOMO level of the electron transport layer is greater than the HOMO level of the light emitting layer, the electron transport layer itself may function as the hole-blocking layer. As one example, by using two or more electron transport layer materials, the electron transport layer may simultaneously function as both the electron transport layer and the hole blocking layer.

In the present disclosure, the charge generation layer (510) is a layer that generates a charge without the application of external voltage, and may cause the two or more light emitting units included in the organic light emitting device to emit light by generating a charge between the light emitting units (210, 220). The charge generation layer (510) according to one example described in the present disclosure may include an n-type organic material layer and a p-type organic material layer. At this time, the n-type organic material layer of the charge generation layer (510) (hereinafter referred to as an "n-type charge generation layer") is disposed closer to the first electrode (110) than the p-type organic material layer of the charge generation layer (510) (hereinafter referred to as a "p-type charge generation layer"). One example of the charge generation layer is shown by the diagram in FIG. 2. The charge generation layer including the n-type charge generation layer (512) disposed closer to the first electrode (110) and the p-type charge generation layer (511) disposed closer to the second electrode is shown by the diagram in FIG. 2.

In one example, the LUMO energy level of the n-type charge generation layer (512) is the same as or greater than the HOMO energy level of the p-type charge generation layer (511), which is more effective in charge generation. For example, the LUMO energy level of the n-type charge generation layer (512) may be 5 to 7 eV, and the HOMO energy level of the p-type charge generation layer (511) may be 5 eV or more.

In the present disclosure, the energy level means the magnitude of energy. Therefore, when the energy level is shown as the (−) direction from the vacuum level, this is interpreted to mean that the energy level is the absolute value of the corresponding energy value. For example, the HOMO energy level means the distance from the vacuum level to the highest occupied molecular orbital. In addition, the LUMO energy level means the distance from the vacuum level to the lowest unoccupied molecular orbital.

A charge may be generated by the NP junction formed between the n-type charge generation layer (512) and the p-type charge generation layer (511). At this time, the LUMO energy level of the n-type charge generation layer (512) and the HOMO energy level of the p-type charge generation layer (511) may be adjusted considering the energy level relationship between the neighboring organic material layers. For example, in the n-type charge generation layer (512) and the p-type charge generation layer (511), the difference between the HOMO energy level of the p-type charge generation layer (511) and the LUMO energy level of the n-type charge generation layer (512) may be adjusted to be 2 eV or less, or 1 eV or less. Judging from the energy levels of the commercially available materials, the energy level difference may be greater than or equal to −1 eV and less than or equal to 1 eV, and greater than or equal to 0.01 eV and less than or equal to 1 eV.

The holes generated between the n-type charge generation layer (512) and the p-type charge generation layer (511) are readily injected into the HOMO energy level of the p-type charge generation layer (511). When the LUMO energy level of the n-type charge generation layer (512) is greater than the HOMO energy level of the p-type charge generation layer (511), an increase in the driving voltage can be prevented since an NP junction is readily formed. In the present disclosure, the NP junction may be formed not only when the n-type organic material layer (512) and the p-type organic material layer (511) are physically adjoined, but when the energy relationship described above is satisfied.

When the NP junction is formed, holes or electrons are readily formed by an external voltage or light source. That is, holes or electrons are simultaneously generated between the n-type charge generation layer (512) and the p-type charge generation layer (511) by the NP junction. The electrons are transported toward the first electron transport layer (310) and the second electron transport layer (410) through the n-type charge generation layer (512). The holes are transported toward the p-type charge generation layer (511). That is, when the LUMO energy level of the n-type charge generation layer (512) is greater than the HOMO energy level of the p-type charge generation layer (511), the holes and the electrons are readily generated, and an increase in the driving voltage for hole injection can be prevented.

In one example of the present disclosure, the HOMO energy level of the p-type charge generation layer (511) may be 5 eV or more. When it is 5 eV or more, hole injection into the adjacent light emitting unit may be effectively performed.

As the materials for the p-type charge generation layer (511), aryl amine-based compounds may be used. One example of the aryl amine-based compounds includes compounds of the following Chemical Formula 1.

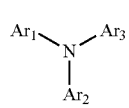

[Chemical Formula 1]

In the above Chemical Formula 1, $Ar_1$, $Ar_2$ and $Ar_3$ are each independently hydrogen or a hydrocarbon group. Herein, at least one of $Ar_1$, $Ar_2$ and $Ar_3$ may include aromatic hydrocarbon substituents, and each substituent may be the same, or they may be composed of different substituents. When $Ar_1$, $Ar_2$ and $Ar_3$ are not aromatic hydrocarbons, they may be hydrogen; a straight-chain, branched-chain or cyclic aliphatic hydrocarbon; or a heterocyclic group including N, O, S or Se.

Specific examples of the above Chemical Formula 1 include the following chemical formulae, however, the scope of the embodiments described in the present disclosure is not limited thereto.

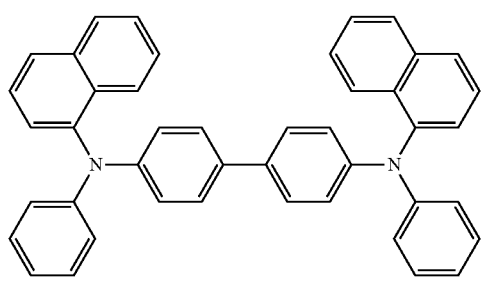

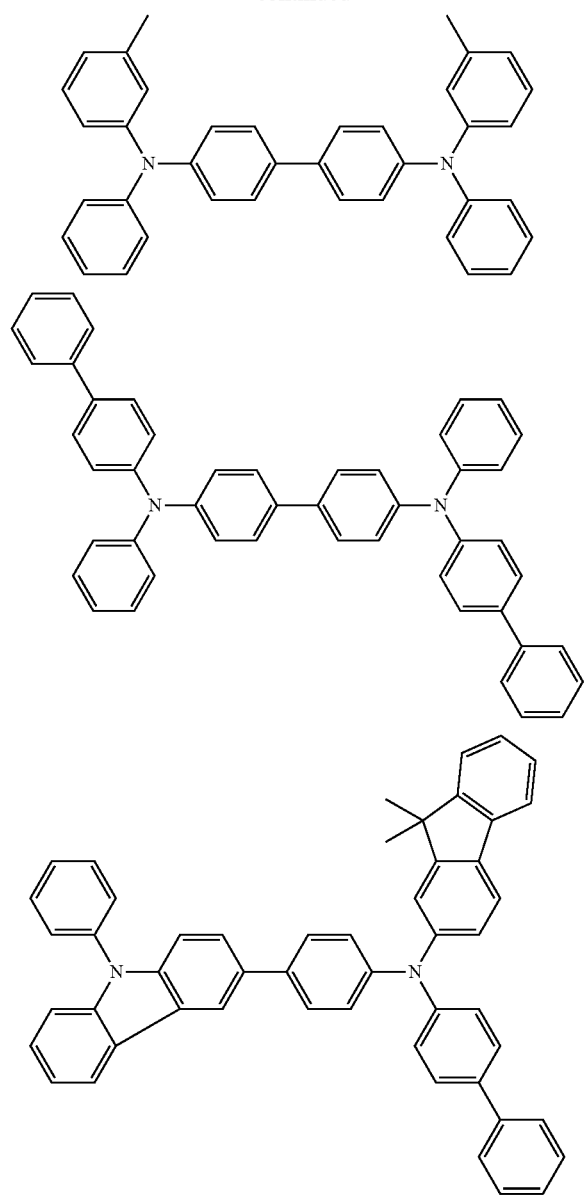
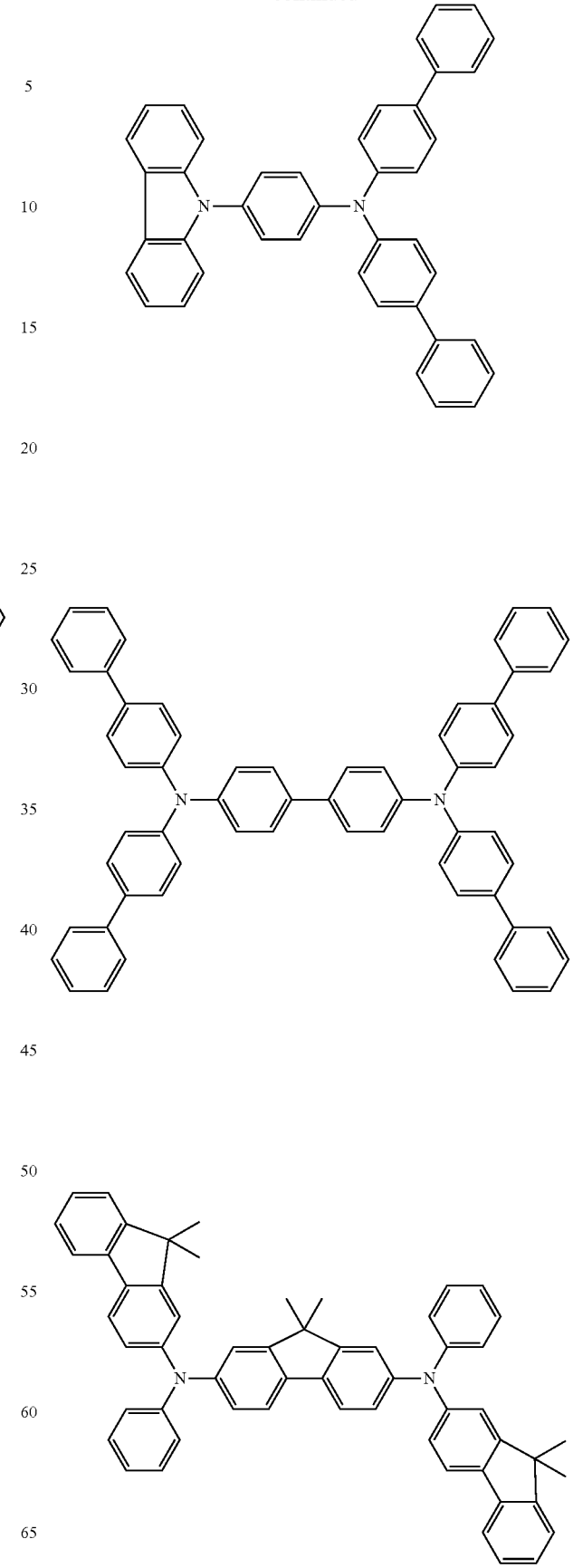

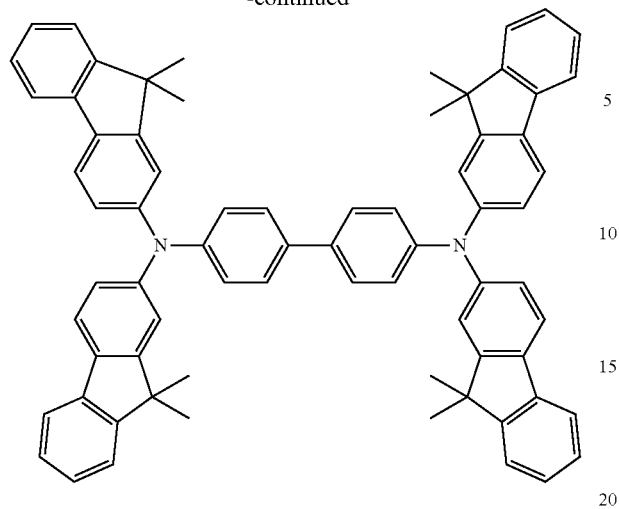
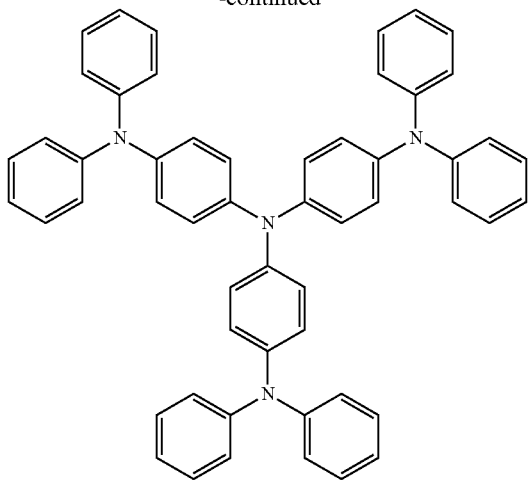
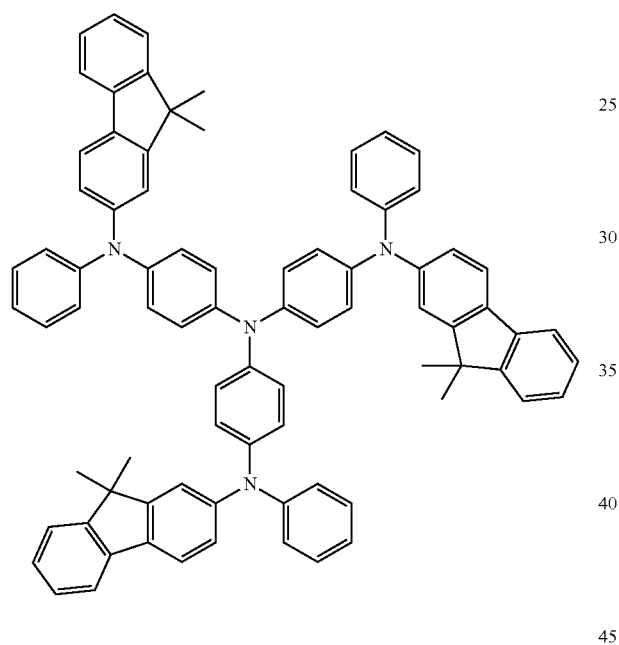
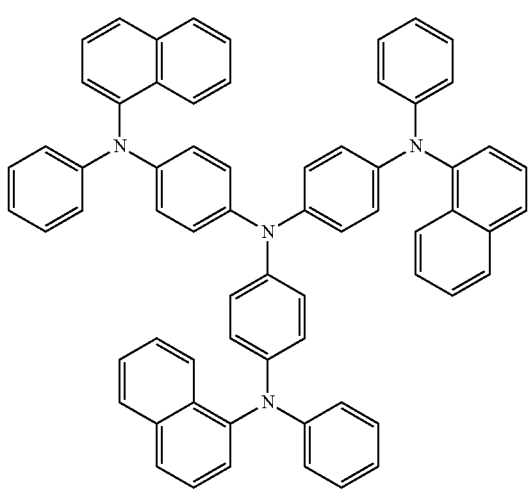
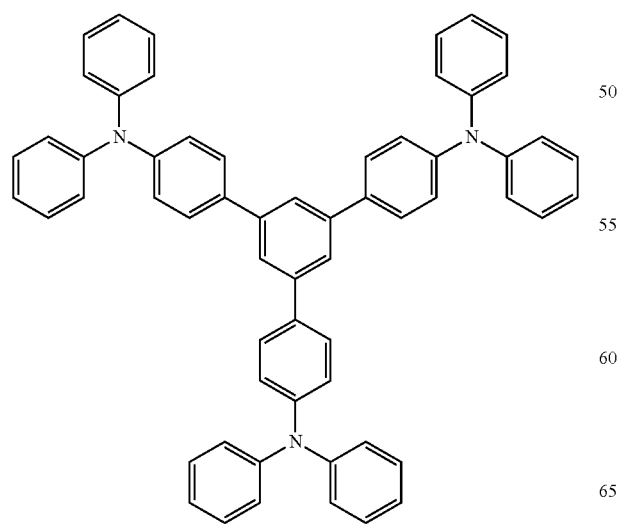
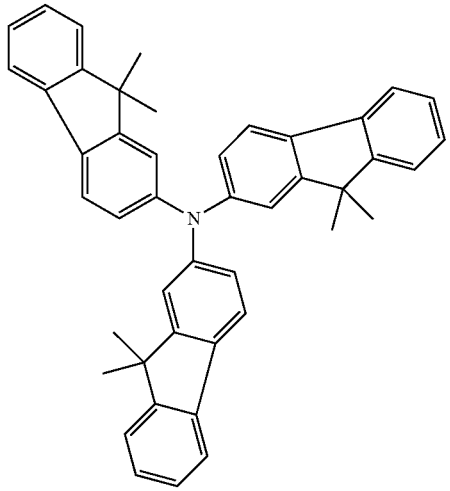

-continued
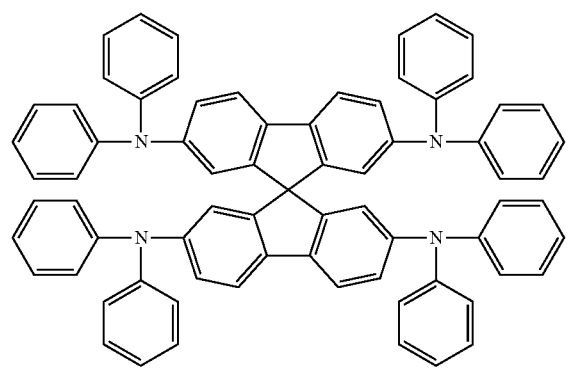
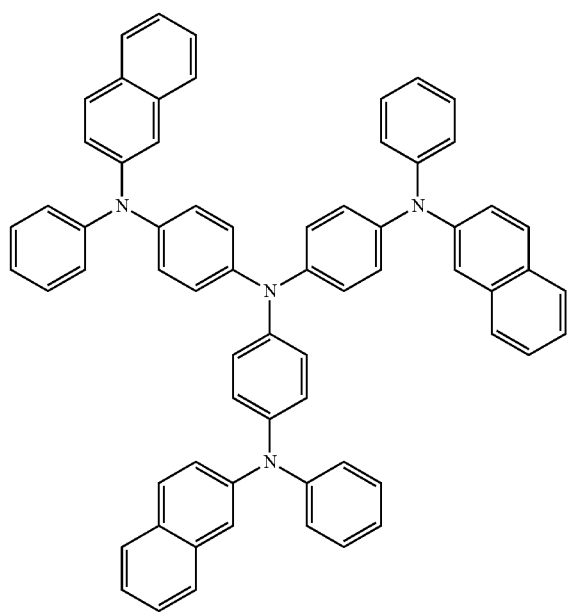
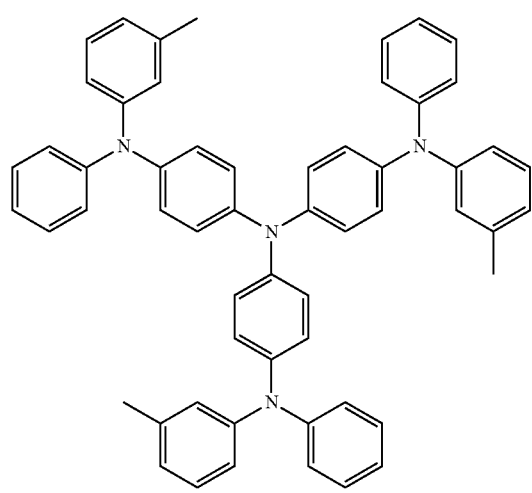
-continued
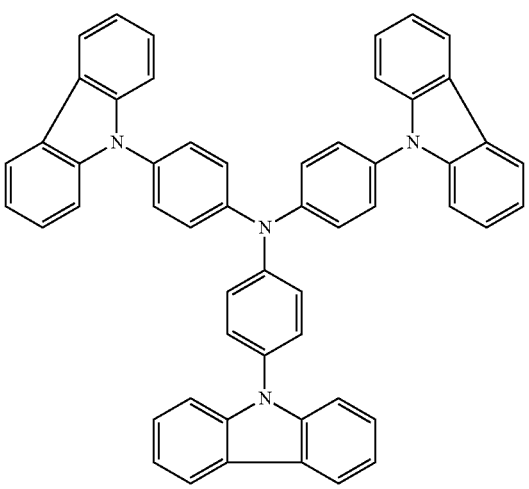
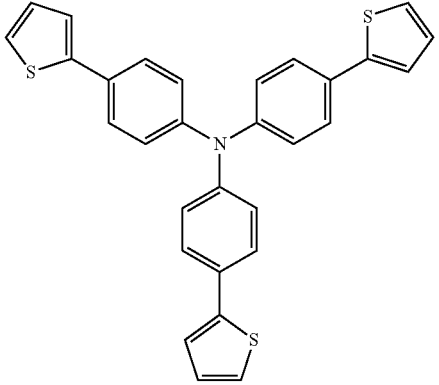
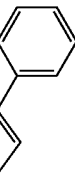

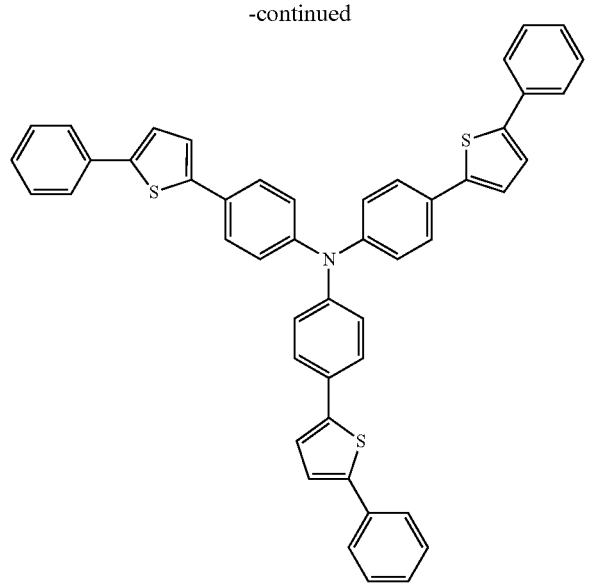

In one example, the n-type charge generation layer (512) may be made of organic materials only. In another example, the n-type charge generation layer (512) may further include transition metal oxides such as $MoO_3$, $V_2O_7$ and $ReO_3$. In still another example, the n-type charge generation layer (512) may include an n-type dopant. At this time, the n-type dopant may be an organic material or an inorganic material. When the n-type dopant is an inorganic material, it may include an alkali metal such as Li, Na, K, Rb, Cs or Fr; an alkali-earth metal such as Be, Mg, Ca, Sr, Ba or Ra; a rare-earth metal such as La, Ce, Pr, Nd, Sm, Eu, Tb, Th, Dy, Ho, Er, Em, Gd, Yb, Lu, Y or Mn; or a metal compound including one or more of the above metals. Furthermore, the n-type dopant may also be a material including cyclopentadiene, cycloheptatriene, a 6-membered heteroring, or a condensed ring including these rings. In this case, the doping concentration may range from 0.01 to 50% by weight, or from 1 to 10% by weight. Within the above doping concentration, a reduction in efficiency due to the absorption of light can be prevented.

The n-type charge generation layer (512) according to one example may include compounds of the following Chemical Formula 2.

[Chemical Formula 2]

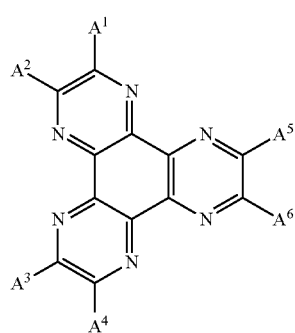

In the above Chemical Formula 2, each of $A^1$ to $A^6$ may be hydrogen, a halogen atom, nitrile (—CN), nitro (—$NO_2$), sulfonyl (—$SO_2R$), sulfoxide (—SOR), sulfonamide (—$SO_2NR$), sulfonate (—$SO_3R$), trifluoromethyl (—$CF_3$), ester (—COOR), amide (—CONHR or —CONRR'), substituted or unsubstituted straight-chain or branched-chain $C_1$-$C_{12}$ alkoxy, substituted or unsubstituted straight-chain or branched-chain $C_1$-$C_{12}$ alkyl, substituted or unsubstituted straight-chain or branched-chain $C_2$-$C_{12}$ alkenyl, a substituted or unsubstituted aromatic or non-aromatic heteroring, substituted or unsubstituted aryl, substituted or unsubstituted mono- or di-arylamine, substituted or unsubstituted aralkylamine, or the like. Herein, each of the above R and R' may be substituted or unsubstituted $C_1$-$C_{60}$ alkyl, substituted or unsubstituted aryl, or a substituted or unsubstituted 5- to 7-membered heteroring, or the like.

Examples of the compound of the above Chemical Formula 2 include the compounds of the following Chemical Formulae 2-1 to 2-6.

[Chemical Formula 2-1]

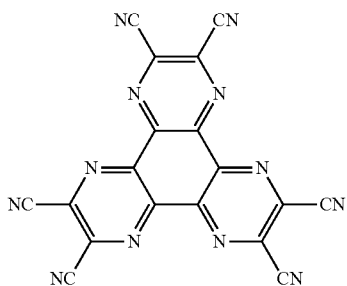

[Chemical Formula 2-2]

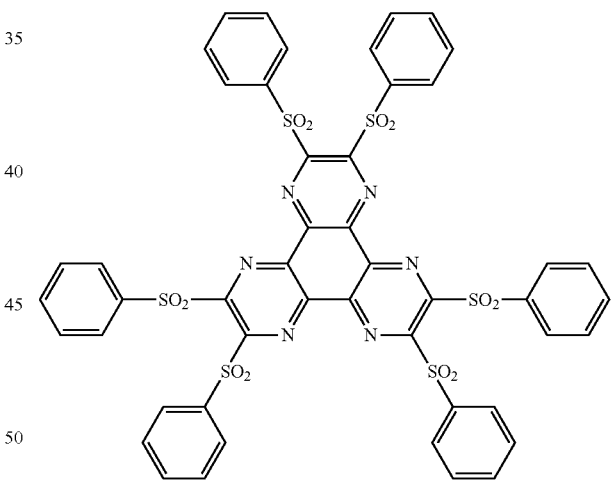

[Chemical Formula 2-3]

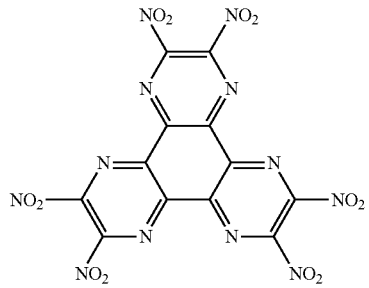

-continued

[Chemical Formula 2-4]

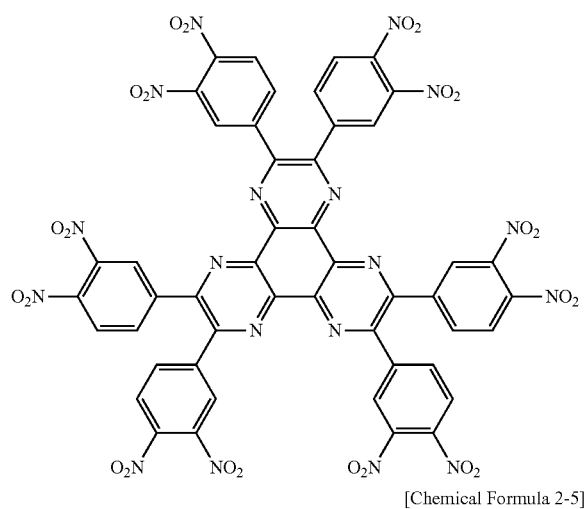

[Chemical Formula 2-5]

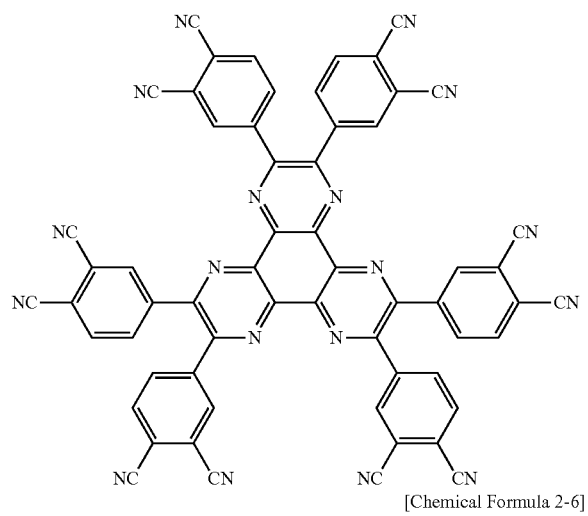

[Chemical Formula 2-6]

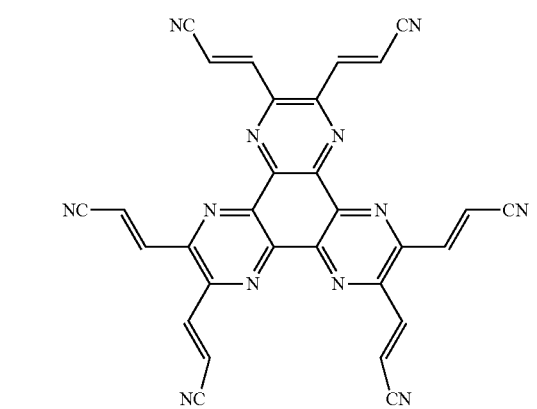

In one example, the n-type charge generation layer (512) may be formed of only one layer, or may include two or more layers. When there are two or more layers, these layers may be formed of identical materials, or may be formed of different materials.

As one example, when the two or more layers are formed of identical materials, one layer may not be doped, and the remaining one layer may be n-type doped. For example, the n-type charge generation layer (512) may have a structure in which a layer formed of the compound of the above Chemical Formula 2 is laminated with a layer in which the compound of the above Chemical Formula 2 is doped with an n-type dopant.

As another example, the n-type charge generation layer (512) may be a layer structure of an inorganic material layer and an organic material layer. Specifically, the n-type charge generation layer (512) may be formed of an $MoO_3$ layer and a layer of the compound of the above Chemical Formula 2.

When the n-type charge generation layer is formed of two or more layers, the layers may be laminated according to the LUMO energy level values. Specifically, when the first layer is formed from a material having a high LUMO energy level, the electron transfer can be smooth since the energy barrier between the two materials can be reduced. As a result, an increase in the driving voltage can be prevented. For example, the $MoO_3$ layer may be formed first, since the LUMO level of $MoO_3$ is approximately 6.7 eV and the LUMO level of the compound of the above Chemical Formula 2-1 is 5.7 eV.

In the present disclosure, the electron transport layer may include the first electron transport layer (310) and the second electron transport layer (410). The first electron transport layer (310) is doped with an n-type dopant. The first electron transport layer (310) plays the role of effectively meeting the Fermi level with the charge generation layer (510) by the doping of an n-type dopant. Therefore, the first electron transport layer (310) may improve electron injection properties by lowering the energy barrier for electron injection from the charge generation layer (510). The LUMO energy level of the n-type doped first electron transport layer has characteristics such that the LUMO energy level of the n-type charge generation layer is formed closer to the Fermi energy level ($E_f$) than that of the electron transport layer that is not doped. Therefore, the energy barrier between the two layers is reduced, and as a result, electron injection properties may be improved (reference: J. Mater. Chem., 2011, 21, 17476-17482).

The difference between the LUMO energy level of the first electron transport layer (310) and the LUMO energy level of the n-type charge generation layer (512) adjacent thereto may be 5 eV or less.

In one example, as the n-type dopant included in the first electron transport layer (310), an alkali metal such as Li, Na, K, Rb, Cs or Fr; an alkali-earth metal such as Be, Mg, Ca, Sr, Ba or Ra; a rare-earth metal such as La, Ce, Pr, Nd, Sm, Eu, Tb, Th, Dy, Ho, Er, Em, Gd, Yb, Lu, Y or Mn; or a metal compound including one or more of the above metals may be used. Herein, the n-type dopant may be in an amount of 1 to 50% by weight based on the total weight of the first electron transport layer (310) material. In the present disclosure, as the method of doping the n-type dopant, methods known in the art may be used, and the scope of the present invention is not limited to any specific method.

The thickness of the first electron transport layer (310) may range from 50 to 100 angstroms. When the thickness of the first electron transport layer (310) including the n-type dopant is 100 angstroms or less, the reduction in light emission efficiency due to the absorption of visible light can be prevented.

The organic light emitting device according to the embodiment of the present disclosure also includes the second electron transport layer (410) doped with one or more types selected from a metal salt, a metal oxide and an organic metal salt. As the metal salt, an alkali metal halide or alkali-earth metal halide such as LiF, NaF, KF, RbF, CsF, $MgF_2$, $CaF_2$, $SrF_2$, $BaF_2$, LiCl, NaCl, KCl, RbCl, CsCl, $MgCl_2$, $CaCl_2$, $SrCl_2$ or $BaCl_2$ may be used. As the metal oxide, an alkali metal oxide or alkali-earth metal oxide such as $LiO_2$, $NaO_2$, $BrO_2$, $Cs_2O$, MgO or CaO may be used. As the organic metal salt, Liq, Naq, Kg and the like of the following Chemical Formula 3 may be used.

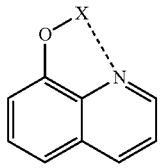

[Chemical Formula 3]

X = Li, Na, K

The thickness of the second electron transport layer (410) may range from 50 to 500 angstroms, more specifically from 50 to 200 angstroms. When the thickness is within the above range, an increase in driving voltage can be efficiently prevented.

The metal salt, metal oxide or organic metal salt may be present in an amount of 1 to 99% by weight based on the total weight of the second electron transport layer (410) material, specifically, an amount of 10 to 50% by weight.

The second electron transport layer (410), by being doped with the metal salt, metal oxide or organic metal salt, may facilitate smooth transfer of the electrons that are transported through the charge generation layer (510) and the first electron transport layer (310) to the light emitting unit (210) adjacent to the first electrode (110). In addition, by preventing the holes from being transferred from the light emitting unit (210) to the charge generation layer (510) through the first electron transport layer (310), the second electron transport layer (410) may significantly reduce the driving voltage as well as improve the light emission efficiency, and may additionally help realize a device with a long lifespan.

Hereinafter, with reference to FIG. 3, the flow of charges between the first electron transport layer (310), the second electron transport layer (410) and the charge generation layer (510) in the organic light emitting device shown by the diagram in FIG. 1 will be described. In FIG. 3, (−) represents electrons and (+) represents holes. Dotted lines represent the flow of electrons, and solid lines represent the flow of holes. Those marked as X means that neither electrons nor holes flow. As described above, a charge is generated due to the separation of holes and electrons in the charge generation layer (510), and the electrons move toward the first electron transport layer (310) and the second electron transport layer (410). In contrast, the holes do not move from the second electron transport layer (410) toward the charge generation layer (510).

When the first electron transport layer (310) and the second electron transport layer (410) shown by the diagram in FIG. 1 are not present in the organic light emitting device, high light emissions efficiency, as described above, cannot be realized. For example, as shown by the diagram in FIG. 4, when the organic light emitting device includes one electron transport layer instead of two electron transport layers having different properties, holes that flow without participating in light emission may be generated in the light emitting unit.

For example, the case can be considered in which an organic light emitting device includes each of two light emitting units (21, 22) between a first electrode (11) and a second electrode (12), and between the light emitting units (21, 22), one electron transport layer (31), for example, an n-type-doped electron transport layer, is formed on the side of the light emitting unit (21) adjacent to the first electrode (11), and a charge generation layer (51) is formed on the side of the light emitting unit (22) adjacent to the second electrode (12). As for the flow of charge in this case, holes that flow without participating in light emission may be generated in the light emitting unit (21), since the holes are transferred from the electron transport layer (31) to the charge generation layer (51) as shown by the diagram in FIG. 5, and as a result, the efficiency of the device may be reduced.

The inventors have found that, even when an n-type-doped electron transport layer doped with an n-type dopant such as Ca is used as the electron transport layer (31), the efficiency of the device is not high, the driving voltage increases, and the useful lifetime of the device is shortened.

However, in the organic light emitting device of the embodiment described in the present disclosure, as shown by the diagram in FIG. 3, the second electron transport layer (410), doped with one or more types selected from among the metal salt, the metal oxide and the organic metal salt, plays the role of preventing the holes transported from the light emitting unit (210) from being transported to the charge generation layer (510) through the first electron transport layer (310) doped with an n-type dopant. In this way, the electrons injected from the charge generation layer (510) can be effectively raised to the LUMO energy level of the first electron transport layer (310) doped with an n-type dopant. As a result, the electrons can be readily transferred to the light emitting unit (210).

Therefore, according to the embodiment of the present disclosure, the driving voltage can be significantly reduced, the efficiency of the device can be significantly improved, and the useful lifetime of the device can be enhanced. When the holes are not properly blocked from the light emitting layer and passed to the hole generation layer, the electron injection from the hole generation layer to the first electron transport layer, from the first electron transport layer to the second electron transport layer, and finally from the second electron transport layer to the light emitting layer becomes difficult.

In this case, in order to inject the electrons to the light emitting layer, more energy is required, which may result in an increase in driving voltage. When the electron injection is difficult, it causes a charge imbalance, which may affect the lifetime of the device. In the embodiments described in the present disclosure, the lifetime of the device can be enhanced by making the electron injection easy, thereby minimizing the charge imbalance. In the present disclosure, the second electron transport layer (410) plays the role of efficiently blocking the holes, and therefore contributes to improving the electron injection capability of the adjacent first electron transport layer (310).

In the present disclosure, as the organic material doped to the first electron transport layer (310) and the second electron transport layer (410), that is, a host material, an organic material that can play the role of transporting the electrons may be used. Identical or different materials may be used as the host materials for the first electron transport layer and the second electron transport layer.

As one example of the host materials for the first and the second electron transport layers (310, 410) that can be used, organic materials or organic metal complexes may be used.

Specifically, hydrocarbon electron transport materials, such as electron transport materials having an n-type substituent in an anthracene core or electron transport materials having an n-type substituent in a bianthracene core, or organic metal complexes, which will be described later, may be used. Herein, the n-type substituent means an electron-withdrawing group, and examples thereof include a ring compound including a heteroatom such as N, O and S within the ring, and a ring compound in which a functional group such as —F, —Br, —Cl, —I or —CN is substituted.

As the host material of the first and the second electron transport layers (310, 410) that can be used in other examples, materials having a low HOMO energy level may be used. For example, the HOMO energy level of the host material of the first and the second electron transport layers (310, 410) may be lower than the HOMO energy level of the organic material layer of the light emitting unit (210) to which the second electron transport layer (410) is adjoined. Although not particularly limited, the lower the HOMO energy level of the host material of the first and the second electron transport layers (310, 410) compared to the HOMO energy level of the organic material layer of the light emitting unit (210) to which the second electron transport layer (410) is adjoined, the better the effects that can be exhibited.

As specific examples, the compound having a functional group selected from an imidazole group, an oxazole group, a thiazole group, a quinoline group and a phenanthroline group may be used as the host material. As other examples, an organic metal complex compound containing at least one type of an alkali metal ion, an alkali-earth metal ion and a rare-earth metal ion may be used as the host material, and as the ligand of the organic metal complex, quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine, hydroxyphenylbenzoimidazole, hydroxybenzotriazole, hydroxyfluborane, bipyridyl, phenanthroline, phthalocyanine, phorphyrin, cyclopentadiene, β-diketones, azomethines, analogues thereof, and the like, may be used, but the examples are not limited thereto. Specifically, $Alq_3$, BAlq and the like may be used as the organic metal complex.

As specific examples, compounds having the following structural formulae may be used as the host material.

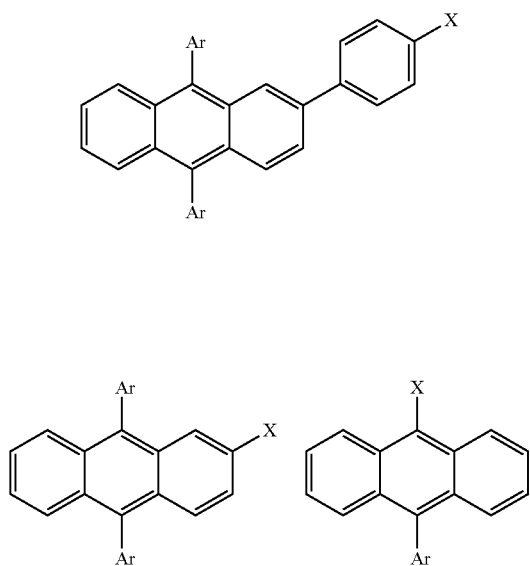

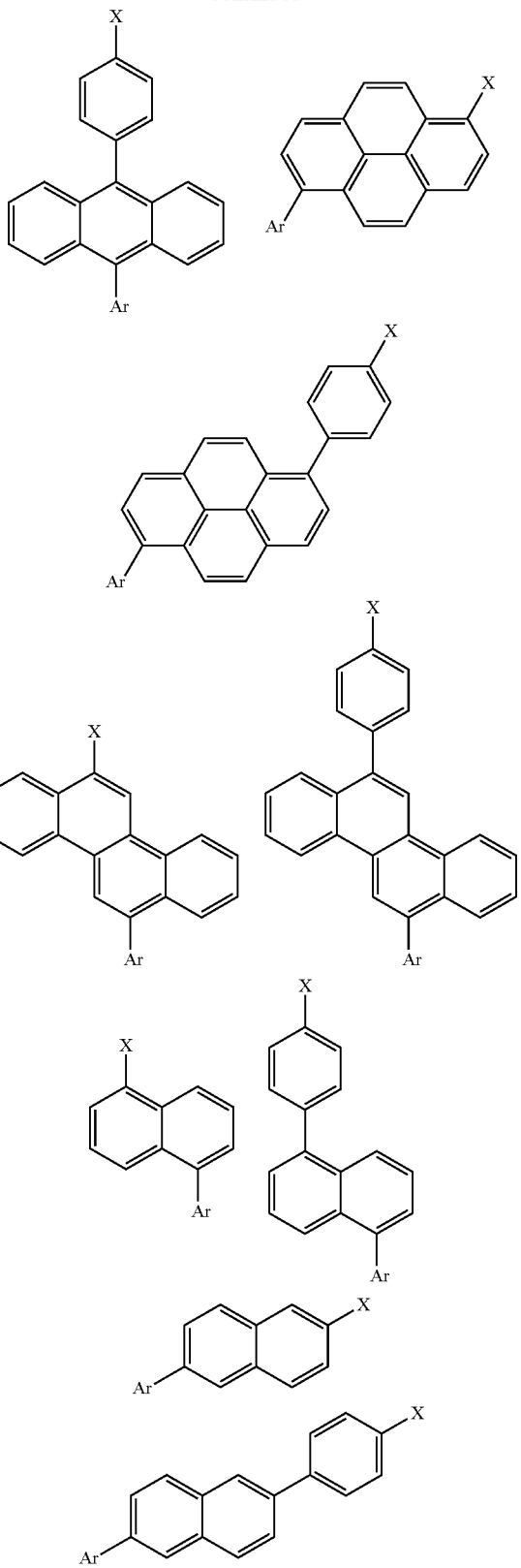

Herein,

Ar is an aryl group, and for example, may be a substituent represented by the following formulae,

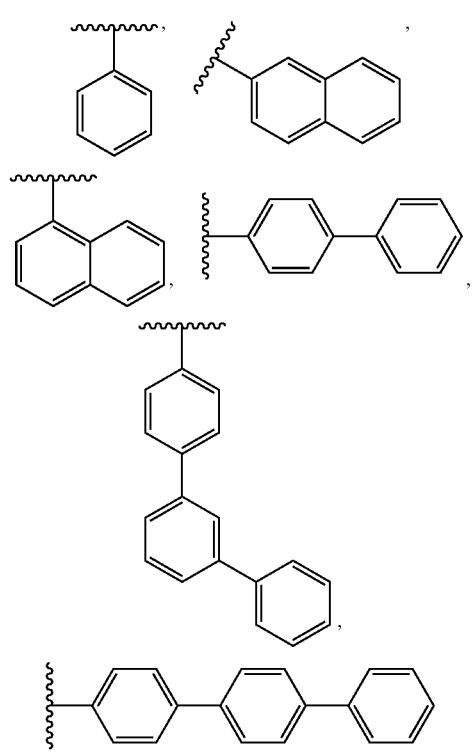

and examples of the above X include the following formulae.

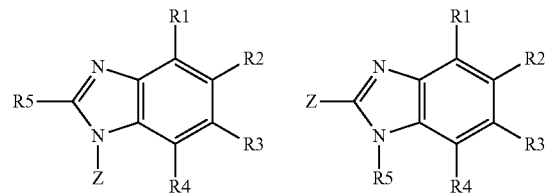

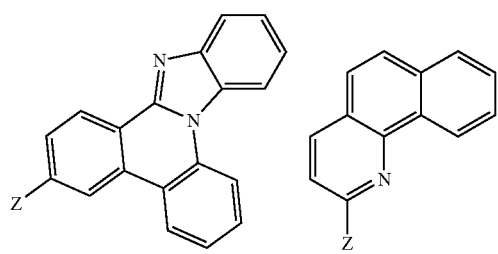

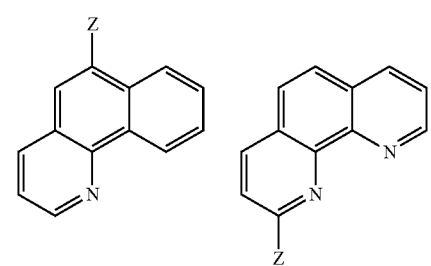

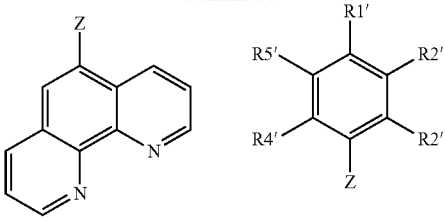

Herein, Z is the portion that links to a core, and in the above formulae, each of R1 to R5 may include an alkyl group such as methyl, ethyl, propyl and butyl, and may be a group including an electron-withdrawing atom such as —F, —Cl, —Br, —I and —CN.

Each of R1' to R5' is a group that includes an electron-withdrawing atom such as —F, —Cl, —Br, —I and —CN.

Additionally, compounds having the following chemical formulae may be used as the first electron transport layer material.

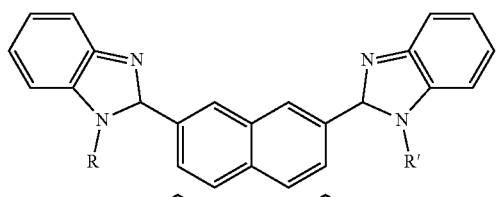

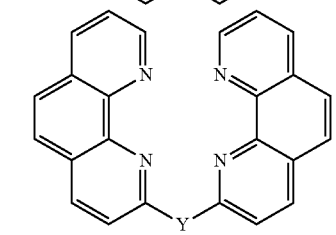

In the above formula, each of R and R' is a $C_1$-$C_{20}$ alkyl group or a $C_6$-$C_{20}$ aryl group, and Y is an arylene group such as phenylene or naphthalene.

Specifically, the compounds having the above chemical formulae include compounds having the following chemical formulae.

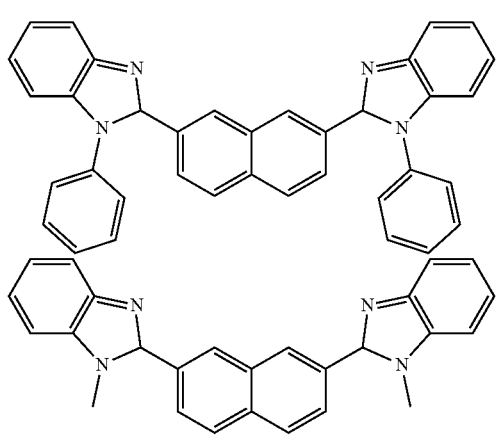

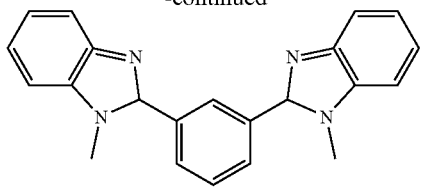
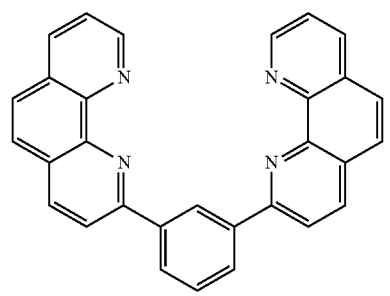
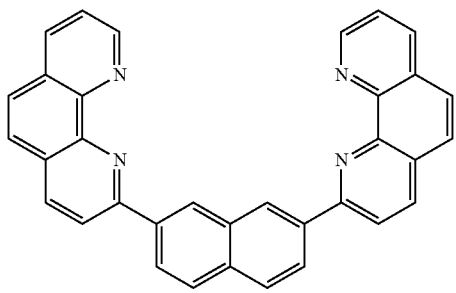
Specific examples of the second electron transport layer material include the following compounds, but are not limited thereto.
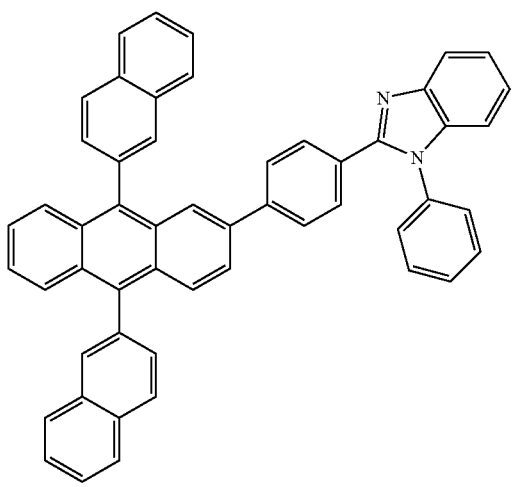
1
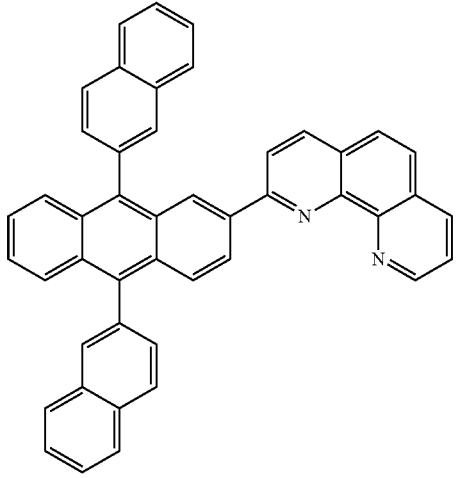
2
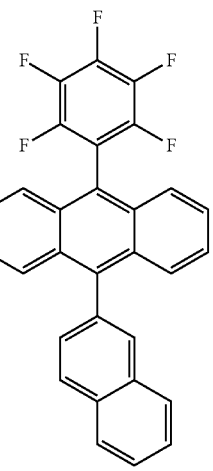
3
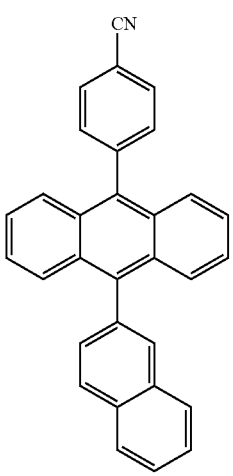
4

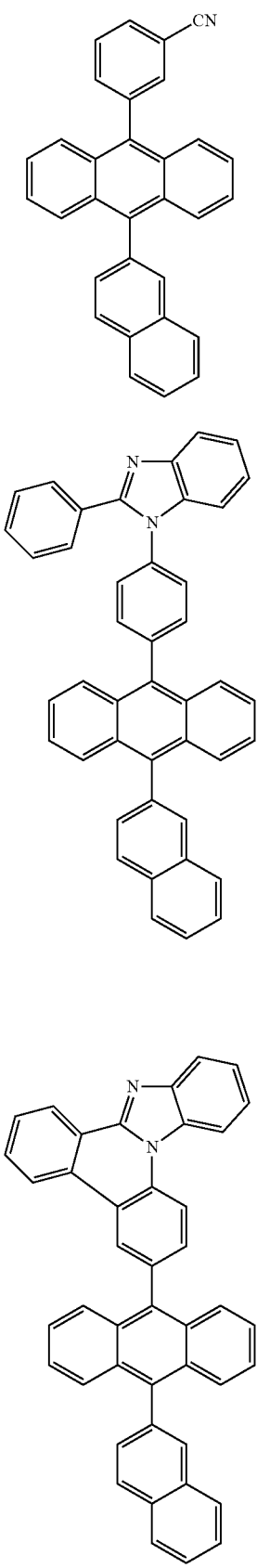
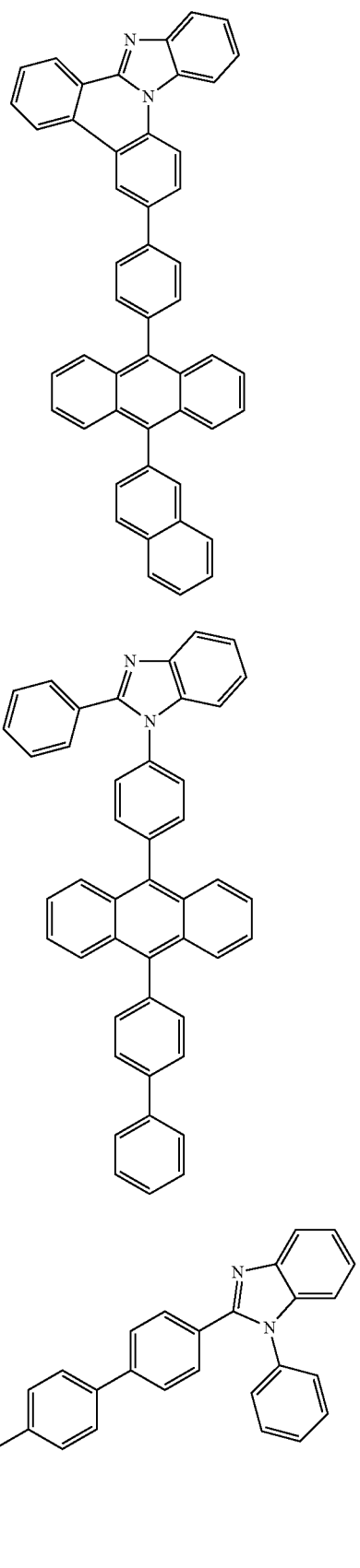

-continued

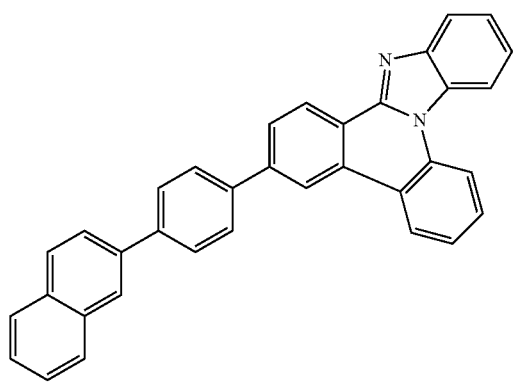

The first electron transport layer may be formed of the same material as the second electron transport layer material described above, and in this case, may further include compounds having the following chemical formulae.

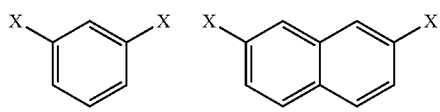

In the above formulae, X is represented by the following formulae.

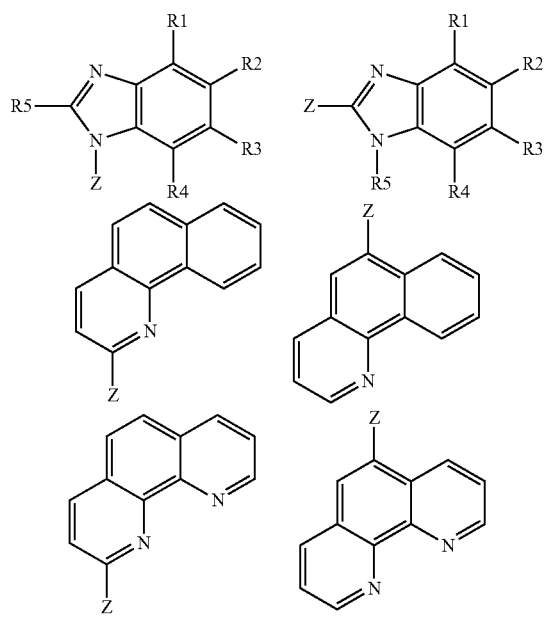

Z is a portion that links to the above core structure, and each of R1 to R5 may include an alkyl group, such as methyl, ethyl, propyl and butyl, and may be a group including an electron-withdrawing atom such as —F, —Cl, —Br, —I and —CN.

In FIG. 1, the case in which only two light emitting units (210, 220) are provided between the first electrode (110) and the second electrode (120) is shown by the diagram, however, according to other embodiments of the present disclosure, three or more light emitting units may be provided between the first electrode (110) and the second electrode (120). The case in which three or more light emitting units are provided is illustrated in FIG. 6.

FIG. 6 illustrates the layer structure of an organic light emitting device including n numbers of light emitting units. After the light emitting unit (210), the second electron transport layer (310), the first electron transport layer (410), the charge generation layer (510), the light emitting unit (220), the second electron transport layer (320), the first electron transport layer (420) and the charge generation layer (520) are laminated on the first electrode (110), additionally, the light emitting unit, the second electron transport layer, the first electron transport layer and the charge generation layer may be repeatedly laminated in this order. Subsequently, after the n-lth light emitting unit, the second electron transport layer, the first electron transport layer and the charge generation layer are laminated, the nth light emitting unit and the second electrode (120) are laminated. In FIG. 6, the structure in which the rest of the layers are laminated on the first electrode is shown by the diagram, but, conversely, the structure in which the rest of the layers are laminated on the second electrode is also included.

In an organic light emitting device according to another embodiment of the present disclosure, an additional electron transport layer is provided between the second electrode (120) and the light emitting unit (220) adjacent to the second electrode (120), and the additional electron transport layer includes a first electron transport layer (320) doped with an n-type dopant and a second electron transport layer (420) doped with a metal salt, metal oxide or organic metal salt. Such an example, in which the additional electron transport layer is provided, is shown by the diagram in FIG. 7. The description of the first electron transport layer (310) and the second electron transport layer (410) made above can be applied to the first electron transport layer (320) and the second electron transport layer (420).

In an organic light emitting device according to still another embodiment of the present disclosure, an additional electron transport layer is provided between the second electrode (120) and the light emitting unit (220) adjacent to the second electrode (120), and the additional electron transport layer includes a first electron transport layer (320) doped with an n-type dopant and a second electron transport layer (420) doped with a metal salt, metal oxide or organic metal salt. Furthermore, an additional charge generation layer (520) is provided between the second electrode and the additional electron transport layer. Such an example, in which the additional electron transport layer and the additional charge generation layer are provided, is shown by the diagram in FIG. 8. The description of the charge generation layer (510) made above can be applied to the charge generation layer (520).

In an organic light emitting device according to still another embodiment of the present disclosure, an additional charge generation layer (520) is provided between the second electrode (120) and the light emitting unit (220) adjacent to the second electrode (120). Such an example, in which the additional charge generation layer is provided, is shown by the diagram in FIG. 9. The description of the charge generation layer (510) made above can be applied to the charge generation layer (520). In the device according to FIG. 9, the light emitting layer or the electron transport layer may be n-type doped.

By the constitutions in FIG. 7 to FIG. 9, materials having more various work functions may be used as the second electrode (120) material.

The organic light emitting device of the embodiments described in the present disclosure may be formed in a top-emission type, bottom-emission type or dual-emission type. In this case, depending on the direction of light emission, the electrode through which light passes may be formed to be transparent. Transparency is not particularly limited to light transmittance as long as the light passes, but for example, can be 70% or more of light transmittance. Transparent electrodes may be prepared using transparent materials, or may be formed from nontransparent materials thinly enough to be transparent.

As the materials of the first electrode and the second electrode, materials having a Fermi energy level of 2 to 6 eV, particularly, 2 to 4 eV, may be used. The electrode material may include materials selected from the group consisting of a metal, a metal oxide and a conductive polymer. Specifically, the electrode material includes carbon, cesium, potassium, lithium, calcium, sodium, magnesium, zirconium, indium, aluminum, silver, tantalum, vanadium, chrome, copper, zinc, iron, tungsten, molybdenum, nickel, gold, other metals and alloys thereof; zinc oxides, indium oxides, tin oxides, indium tin oxides (ITO), indium zinc oxide (IZO) and other analogous metal oxides; and mixtures of oxides and metals such as ZnO:Al and $SnO_2$:Sb. In other words, the electrodes may be formed as metal electrodes, and also may be formed as transparent electrodes made of transparent materials such as metal oxides. The first electrode materials and the second electrode materials may be the same as or, if necessary, different from each other.

The organic light emitting device according to one embodiment of the present disclosure may have a structure in which the first electrode is adjoined to a substrate as an anode, and the second electrode faces the first electrode as a cathode. The organic light emitting device according to other embodiments of the present invention may have a structure in which the second electrode is adjoined to a substrate as a cathode, and the first electrode faces the second electrode as an anode.

The organic light emitting device according to one embodiment of the present disclosure may be a device that includes a light scattering structure.

In one embodiment of the present disclosure, the organic light emitting device may further include a substrate on a surface opposite the surface on which the light emitting unit of the first electrode is provided, and may further include a light scattering layer between the substrate and the first electrode, or on a surface opposite the surface on which the first electrode is provided.

In one embodiment of the present disclosure, an inside light scattering layer may be further included between the first electrode and the substrate provided on a surface opposite the surface on which the light emitting unit of the first electrode is provided. In another embodiment, in the substrate, an outside light scattering layer may be additionally included on a surface opposite the surface on which the first electrode is provided.

In the present disclosure, the inside light scattering layer or outside light scattering layer is not particularly limited as long as it has a structure that can improve the light scattering efficiency of the device by inducing light scattering. In one embodiment, the light scattering layer may have a structure in which scattering particles are dispersed within a binder. In another embodiment, the light scattering layer may use an uneven film.

In addition, the light scattering layer may be directly formed on the substrate using methods such as spin coating, bar coating and slit coating, or may be formed using methods in which the light scattering layer is prepared in the form of a film and is attached.

In one embodiment of the present disclosure, the organic light emitting device is a flexible organic light emitting device. In this case, the substrate includes a flexible material. As examples thereof, thin-film type glass that can bend, plastic or film-type substrates may be used.

The material of the plastic substrate is not particularly limited, however, generally, films such as PET, PEN and PI may be used in the form of a monolayer or multilayer.

In one embodiment of the present disclosure, a display device that includes the organic light emitting device is provided.

In one embodiment of the present disclosure, an illumination device that includes the organic light emitting device is provided.

Hereinafter, various embodiments and characteristics of the present disclosure will be described in greater detail with reference to examples and comparative examples. It is to be understood, however, that the following examples are for illustrative purposes only, and are not intended to limit the scope of the present disclosure.

EXAMPLE 1

1,500 Å of ITO was formed as an anode on a glass substrate using a sputtering method, HAT of the above Chemical Formula 2-1 was formed thereon as a film having a thickness of 300 Å using thermal vacuum deposition, and subsequently, a layer was formed to a thickness of 600 Å using NPB. A fluorescent blue light emitting layer was formed thereon to a thickness of 300 Å, and the second electron transport layer, having a thickness of 150 Å, was formed by doping LiF to the following Material 1 in an amount of 50% by weight. The first electron transport layer having a thickness of 50 Å was formed thereon by doping Ca to the following Material 1 in an amount of 10% by weight.

Material 1

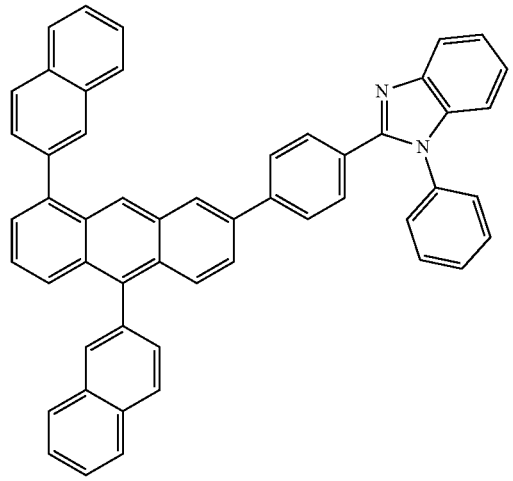

Next, the charge generation layer was formed with a HAT layer of 300 Å and an NPB layer of 300 Å, and a phosphorescent green and red light emitting layer was formed to a thickness of 300 Å. Next, the electron transport layer was formed to a thickness of 450 Å using the following Material 2, and lastly, a cathode with LIF having a thickness of 15 Å, and aluminum having a thickness of 1,000 Å was formed to produce a white organic light emitting device having a layer structure.

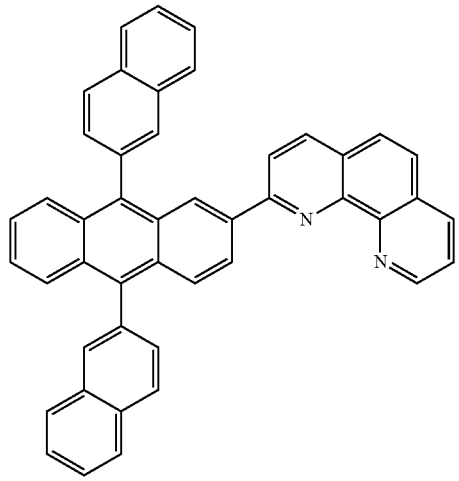

Material 2

EXAMPLE 2

The device was prepared in the same manner as in Example 1 except that the second electron transport layer was formed by doping Liq, an organic metal salt, to the above Material 1 in an amount of 50% by weight.

COMPARATIVE EXAMPLE 1

The device was prepared in the same manner as in Example 1 except that the second electron transport layer was formed to a thickness of 150 Å using Material 1 without doping with a metal salt or an organic metal salt.

The resultant voltages and efficiencies of Examples 1 and 2 and Comparative Example 1 were measured in a 3 mA/cm² area, and are compared and shown in the following Table 1.

TABLE 1

|  | Example 1 | Example 2 | Comparative Example 1 |
| --- | --- | --- | --- |
| Voltage (V) | 6.3 | 6.3 | 7.3 |
| Current Efficiency (cd/A) | 48 | 50 | 45 |

EXAMPLE 3

The device was prepared in the same manner as in Example 1 except that the above Material 2 was used instead of the above Material 1 when the second electron transport layer and the first electron transport layer were formed.

COMPARATIVE EXAMPLE 2

The device was prepared in the same manner as in Example 3 except that the second electron transport layer was formed to a thickness of 150 Å using Material 2 without doping with a metal salt or an organic metal salt.

COMPARATIVE EXAMPLE 3

The device was prepared in the same manner as in Example 3 except that the second electron transport layer was formed to a thickness of 200 Å without forming the first electron transport layer.

COMPARATIVE EXAMPLE 4

The device was prepared in the same manner as in Example 3 except that the first electron transport layer was formed to a thickness of 200 Å without forming the second electron transport layer.

The resultant voltages and efficiencies of Example 3 and Comparative Examples 2 to 4 were measured in a 3 mA/cm² area, and are compared and shown in the following Table 2.

TABLE 2

|  | Example 3 | Comparative Example 2 | Comparative Example 3 | Comparative Example 4 |
| --- | --- | --- | --- | --- |
| Voltage (V) | 5.6 | 6.3 | 15.0 | 6.5 |
| Current Efficiency (cd/A) | 55 | 52 | 43 | 40 |

EXAMPLE 4

1,500 Å of ITO was formed as an anode on a glass substrate using a sputtering method, and HAT of the above Chemical Formula 2-1 was formed thereon as a film having a thickness of 300 Å using thermal vacuum deposition, and subsequently, a layer was formed to a thickness of 600 Å using NPB. A fluorescent blue light emitting layer was formed thereon to a thickness of 300 Å, and the second electron transport layer, having a thickness of 150 Å, was formed by doping LiF to the above Material 2 in an amount of 50% by weight. The first electron transport layer having a thickness of 50 Å was formed thereon by doping Ca to the above Material 2 in an amount of 10% by weight.

Next, the charge generation layer was formed with a HAT layer of 300 Å and an NPB layer of 300 Å, and a phosphorescent green and red light emitting layer was formed to a thickness of 300 Å. Next, the second electron transport layer was formed to a thickness of 400 Å by co-depositing LiF to the above Material 2 in an amount of 50% by weight, and the first electron transport layer was formed thereon to a thickness of 50 Å by doping Ca to the above Material 2 in an amount of 10% by weight. Lastly, a cathode with aluminum having a thickness of 1,000 Å was formed to produce a white organic light emitting device having a layer structure.

COMPARATIVE EXAMPLE 5

The device was prepared using the same constitution and method as in Example 4 except that the second electron transport layer and the first electron transport layer were not formed on the portion adjoining the charge generation layer, and the second electron transport layer and the first electron transport layer were formed only on the portion adjoining the cathode.

The resultant voltages and efficiencies of Example 4 and Comparative Example 5 were measured in a 3 mA/cm² area, and are compared and shown in the following Table 3.

TABLE 3

| | Example 4 | Comparative Example 5 |
|---|---|---|
| Voltage (V) | 5.6 | 15.0 |
| Current Efficiency (cd/A) | 52 | 40 |

EXAMPLE 5

The device was prepared in the same manner as in Example 1 except that the following Material 5 was used instead of Material 1 when the second electron transport layer and the first electron transport layer were formed on the portion adjoining the charge generation layer.

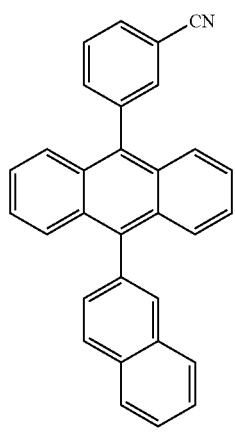

Material 5

EXAMPLE 6

The device was prepared in the same manner as in Example 1 except that the following Material 7 was used instead of Material 1 when the second electron transport layer and the first electron transport layer were formed on the portion adjoining the charge generation layer.

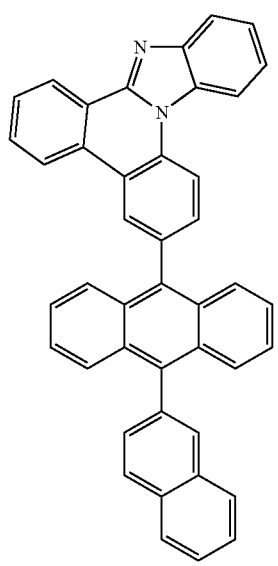

Material 7

EXAMPLE 7

The device was prepared in the same manner as in Example 1 except that the following Material 9 was used instead of Material 1 when the second electron transport layer and the first electron transport layer were formed on the portion adjoining the charge generation layer.

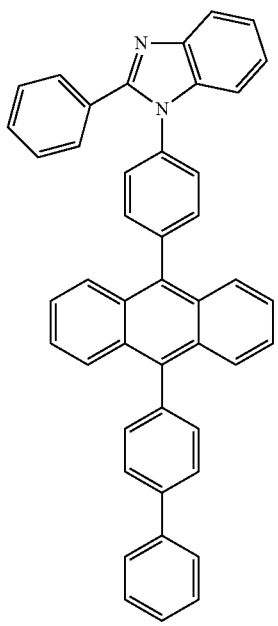

Material 9

EXAMPLE 8

The device was prepared in the same manner as in Example 1 except that the following Material 11 was used instead of Material 1 when the second electron transport layer and the first electron transport layer were formed on the portion adjoining the charge generation layer.

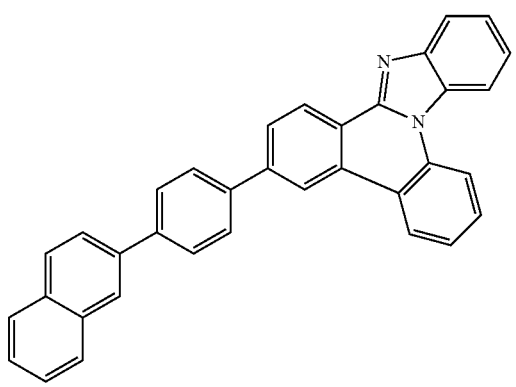

Material 11

The resultant voltages and efficiencies of Examples 5 to 8 were measured in a 3 mA/cm$^2$ area, and are compared and shown in the following Table 4.

TABLE 4

|  | Example 5 | Example 6 | Example 7 | Example 8 |
|---|---|---|---|---|
| Voltage (V) | 5.6 | 5.6 | 5.6 | 5.5 |
| Current Efficiency (cd/A) | 55 | 55 | 55 | 55 |

EXAMPLE 9

The device was prepared in the same manner as in Example 1 except that, in the portion adjoining the charge generation layer, the second electron transport layer was formed to a thickness of 150 Å by co-depositing LiF to the above Material 2 in an amount of 50% by weight, and the first electron transport layer was formed to a thickness of 50 Å by doping Ca to the following Material 13 in an amount of 10% by weight.

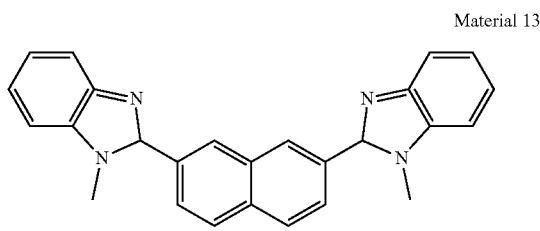

Material 13

EXAMPLE 10

The device was prepared in the same manner as in Example 9 except that, in the portion adjoining the charge generation layer, the Ca doping was performed to an amount of 5% by weight when the first electron transport layer was formed.

EXAMPLE 11

The device was prepared in the same manner as in Example 9 except that, in the portion adjoining the charge generation layer, the Ca doping was performed to an amount of 2.5% by weight when the first electron transport layer was formed.

COMPARATIVE EXAMPLE 6

The device was prepared in the same manner as in Example 9 except that, in the portion adjoining the charge generation layer, the second electron transport layer was formed to a thickness of 150 Å using only the above Material 2 without including the metal salt or organic metal salt, and the first electron transport layer was formed to a thickness of 50 Å by doping Ca to the above Material 13 in an amount of 10% by weight.

COMPARATIVE EXAMPLE 7

The device was prepared in the same manner as in Example 9 except that the second electron transport layer was formed to a thickness of 150 Å by being doped with Ca in an amount of 10% by weight, therefore the second electron transport layer was formed with the same material as the material doped to the first electron transport layer.

COMPARATIVE EXAMPLE 8

The device was prepared in the same manner as in Example 9 except that the first electron transport layer was formed to a thickness of 50 Å by being doped with LiF in an amount of 50% by weight, therefore the first electron transport layer was formed with the same material as the material doped to the second electron transport layer.

COMPARATIVE EXAMPLE 9

The device was prepared in the same manner as in Example 9 except that the HAT, which is the n-type charge generation layer adjoining the first electron transport layer, was not formed.

The resultant voltages and efficiencies of Examples 9 to 11 and Comparative Example 6 to Comparative Example 9 were measured in a 3 $mA/cm^2$ area, and are compared and shown in the following Table 5.

TABLE 5

|  | Voltage (V) | Current Efficiency (cd/A) |
|---|---|---|
| Example 9 | 5.6 | 55 |
| Example 10 | 5.6 | 58 |
| Example 11 | 5.5 | 60 |
| Comparative Example 6 | 5.8 | 55 |
| Comparative Example 7 | 6.0 | 30 |
| Comparative Example 8 | 14.0 | 44 |
| Comparative Example 9 | 16.0 | 42 |

A graph of voltage-current and a graph of the usable life of a device in which the second electron transport layer was doped with a metal salt, such as LiF (Example 11), and a device in which the second electron transport layer was not doped (Comparative Example 6), are shown by the diagrams in FIG. 10 and FIG. 11. It was demonstrated that the device in which the second electron transport layer was doped with a metal salt and the like had a lower initial voltage, experienced a very small voltage increase while being driven, and had an increased useful lifetime compared with the device in which the second electron transport layer was not doped.

In Comparative Examples 7 and 8, the material doped to the second electron transport layer and the first electron transport layer were the same in the device, and the device was doped using Ca and LiF, respectively.

In Comparative Example 7, the efficiency of the device was rapidly reduced, and this phenomenon was due to light emitting quenching since the doping layer of Ca was adjacent to the light emitting layer. In addition, when the first electron transport layer and the second electron transport layer are all doped with an n-type dopant, light absorption can increase. Light efficiency can be reduced when the second electron transport layer adjoining the light emitting layer is doped with metal.

In Comparative Example 8, the driving voltage significantly increased since LiF doped to the first electron transport layer had insulation properties, and the n-type charge generation layer was not reactive with HAT, therefore, electron injection from the HAT layer to the first electron transport layer was not easy.

In Comparative Example 9, the emission of blue light from the first light emitting unit was not observed, and only the emission of yellow light from the second light emitting unit was observed, which means that the tandem structure did not function effectively since the HAT, an n-type charge generation layer, was not formed.

The invention claimed is:

1. An organic light emitting device comprising:
   a first electrode;
   a second electrode; and
   two or more light emitting units provided between the first electrode and the second electrode,
   wherein a charge generation layer is provided between, among the light emitting units, two light emitting units that are adjacent to each other, an electron transport layer is provided between the charge generation layer and the light emitting unit placed closer to the first electrode of the two adjacent light emitting units, and the electron transport layer includes a first electron transport layer doped with an n-type dopant, and a second electron transport layer doped with a metal salt, metal oxide or organic metal salt.

2. The organic light emitting device of claim 1, wherein the first electron transport layer is provided between the second electron transport layer and the charge generation layer.

3. The organic light emitting device of claim 1, wherein an additional electron transport layer is provided between the second electrode and the light emitting unit adjacent to the second electrode, and the additional electron transport layer includes a first electron transport layer doped with an n-type dopant, and a second electron transport layer, doped with a metal salt, metal oxide or organic metal salt.

4. The organic light emitting device of claim 3, wherein an additional charge generation layer is provided between the second electrode and the additional electron transport layer.

5. The organic light emitting device of claim 1, wherein an additional charge generation layer is provided between the second electrode and the light emitting unit adjacent to the second electrode.

6. The organic light emitting device of claim 1, wherein the charge generation layer includes an n-type organic material layer and a p-type organic material layer.

7. The organic light emitting device of claim 6, wherein the LUMO energy level of the n-type organic material layer of the charge generation layer is the same as or greater than the HOMO energy level of the p-type organic material layer of the charge generation layer.

8. The organic light emitting device of claim 6, wherein a difference between the HOMO energy level of the p-type organic material layer of the charge generation layer and the LUMO energy level of the n-type organic material layer of the charge generation layer is 2 eV or less.

9. The organic light emitting device of claim 6, wherein the LUMO energy level of the n-type organic material layer of the charge generation layer is 5 eV to 7 eV.

10. The organic light emitting device of claim 6, wherein the HOMO energy level of the p-type organic material layer of the charge generation layer is 5 eV or more.

11. The organic light emitting device of claim 6, wherein the n-type organic material layer of the charge generation layer includes a compound of the following Chemical Formula 2:

[Chemical Formula 2]

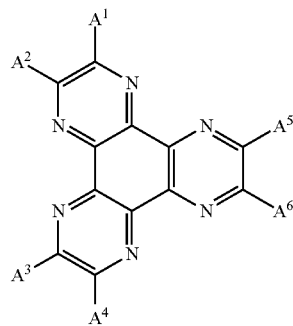

in Chemical Formula 2, each of $A^1$ to $A^6$ is hydrogen, a halogen atom, nitrile (—CN), nitro (—$NO_2$), sulfonyl (—$SO_2$R), sulfoxide (—SOR), sulfonamide (—$SO_2$NR), sulfonate (—$SO_3$R), trifluoromethyl (—$CF_3$), ester (—COOR), amide (—CONHR or —CONRR'), substituted or unsubstituted straight-chain or branched-chain $C_1$-$C_{12}$ alkoxy, substituted or unsubstituted straight-chain or branched-chain $C_1$-$C_{12}$ alkyl, substituted or unsubstituted straight-chain or branched-chain $C_2$-$C_{12}$ alkenyl, a substituted or unsubstituted aromatic or non-aromatic heteroring, substituted or unsubstituted aryl, substituted or unsubstituted mono- or di-arylamine, substituted or unsubstituted aralkylamine, and each of R and R' may be substituted or unsubstituted $C_1$-$C_{60}$ alkyl, substituted or unsubstituted aryl, or a substituted or unsubstituted 5- to 7-membered heteroring.

12. The organic light emitting device of claim 11, wherein the compound of the above Chemical Formula 2 is represented by any one of the following Chemical Formulae 2-1 to 2-6:

[Chemical Formula 2-1]

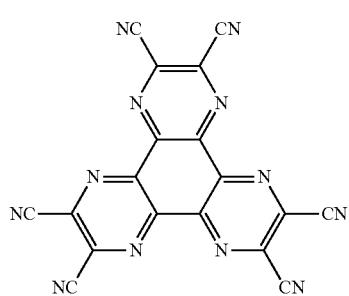

[Chemical Formula 2-2]

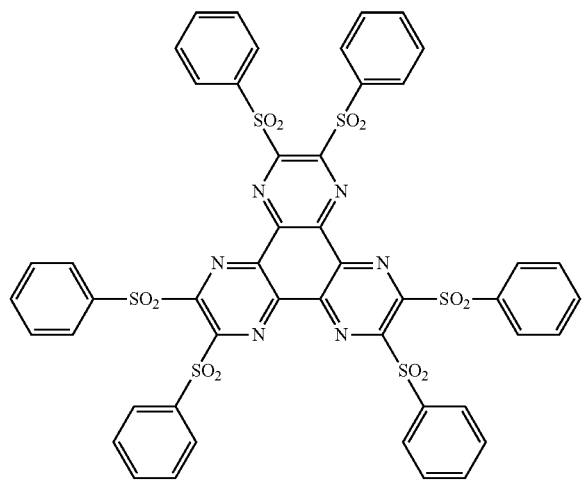

[Chemical Formula 2-3]

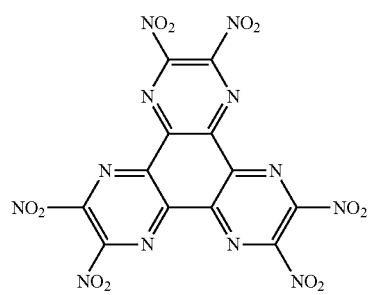

[Chemical Formula 2-4]

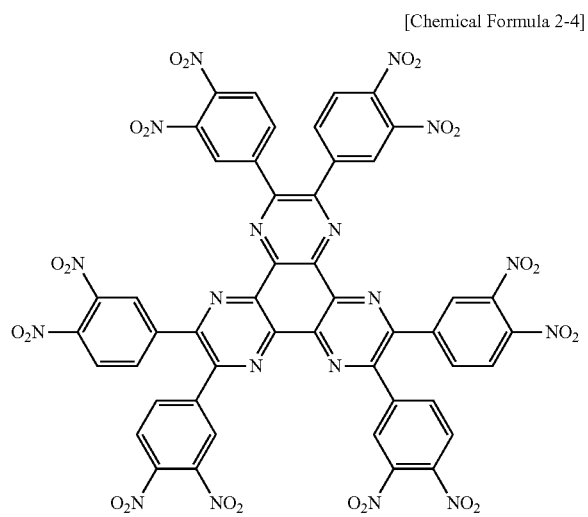

[Chemical Formula 2-5]

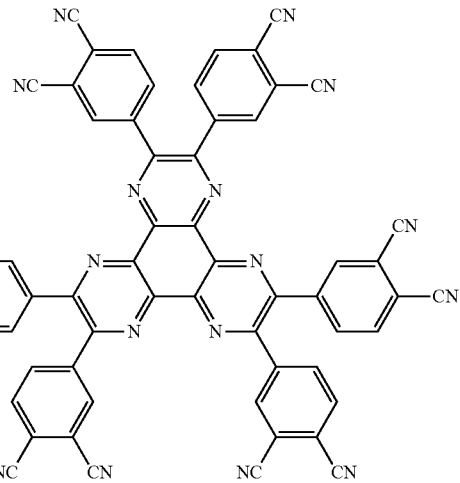

[Chemical Formula 2-6]

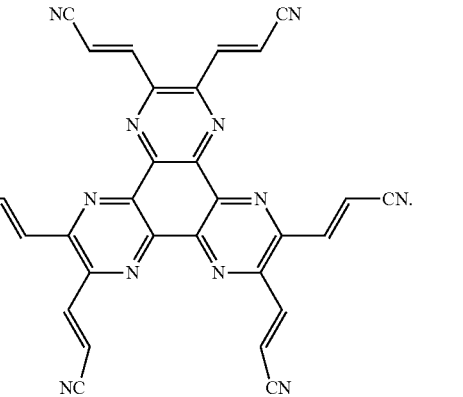

13. The organic light emitting device of claim 1, wherein an n-type dopant of the first electron transport layer includes one or more types selected from the group consisting of an alkali metal, an alkali-earth metal, a rare-earth metal and a metal compound.

14. The organic light emitting device of claim 1, wherein the n-type dopant of the first electron transport layer includes one or more selected from Li, Na, K, Rb, Cs, Fr, Be, Mg, Ca, Sr, Ba, Ra, La, Ce, Pr, Nd, Sm, Eu, Tb, Th, Dy, Ho, Er, Em, Gd, Yb, Lu, Y, Mn, and a metal compound including one or more metals selected from among the above metals.

15. The organic light emitting device of claim 1, wherein the n-type dopant of the first electron transport layer is included in an amount of 1 to 50% by weight based on the total weight of the first electron transport layer.

16. The organic light emitting device of claim 1, wherein a thickness of the first electron transport layer ranges from 50 angstroms to 100 angstroms.

17. The organic light emitting device of claim 1, wherein the second electron transport layer is doped with a halide or oxide of an alkali metal or alkali-earth metal, or with an organic metal complex.

18. The organic light emitting device of claim 1, wherein the second electron transport layer is doped with one or more selected from LiF, NaF, KF, RbF, CsF, $MgF_2$, $CaF_2$, $SrF_2$, $BaF_2$, LiCl, NaCl, KCl, RbCl, CsCl, $MgCl_2$, $CaCl_2$, $SrCl_2$, $BaCl_2$, $LiO_2$, $NaO_2$, $BrO_2$, $Cs_2O$, MgO, CaO, Liq, Naq and Kq.

19. The organic light emitting device of claim 1, wherein a content of the metal salt, metal oxide or organic metal salt in the second electron transport layer ranges from 10 to 50% by weight based on the total weight of the second electron transport layer.

20. The organic light emitting device of claim 1, wherein a thickness of the second electron transport layer ranges from 50 angstroms to 500 angstroms.

21. The organic light emitting device of claim 1, wherein the light emitting unit includes one or more light emitting layers.

22. The organic light emitting device of claim 21, wherein the light emitting unit further includes one or more layers of a hole transport layer, a hole injection layer, a layer for transporting and injecting holes, a buffer layer, an electron blocking layer, an electron transport layer, an electron injection layer, a layer for transporting and injecting electrons and a hole blocking layer.

23. The organic light emitting device of claim 1, wherein the first electron transport layer and the second electron transport layer each independently include an electron transport material having an n-type substituent in an anthracene core, an electron transport material having an n-type substituent in a bianthracene core, or an organic metal complex.

24. The organic light emitting device of claim 1, wherein the first electron transport layer and the second electron transport layer each independently include one or more types of a compound having a functional group selected from an imidazole group, an oxazole group, a thiazole group, a quinoline group and a phenanthroline group; and an organic metal complex compound containing at least one type of an alkali-earth metal ion and a rare-earth metal ion.

25. The organic light emitting device of claim 23, wherein a ligand of the organic metal complex is selected from quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine, hydroxyphenylbenzoimidazole, hydroxybenzotriazole, hydroxyfluborane, bipyridyl, phenanthroline, phthalocyanine, phorphyrin, cyclopentadiene, β-diketones and azomethines.

26. The organic light emitting device of claim 1, wherein the first electron transport layer and the second electron transport layer each independently include one or more types selected from the compounds having the following structural formulae:

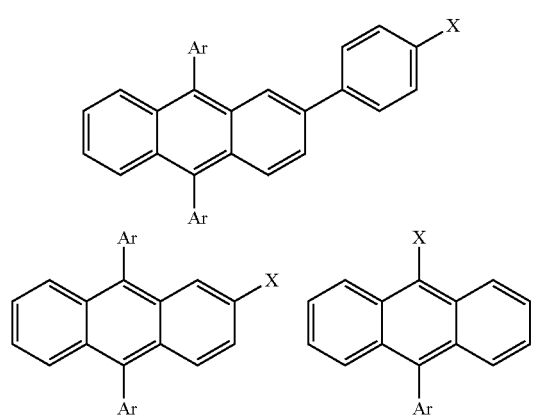

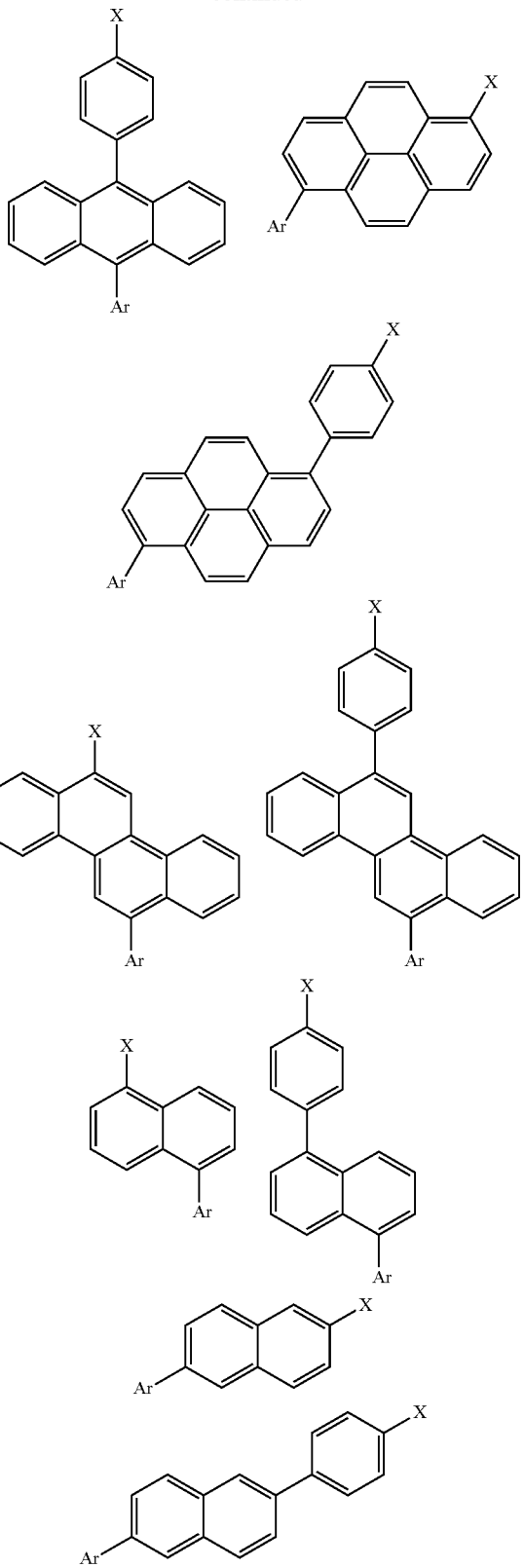

in the above formulae,

Ar is an aryl group,

X is selected from the following structural formulae,

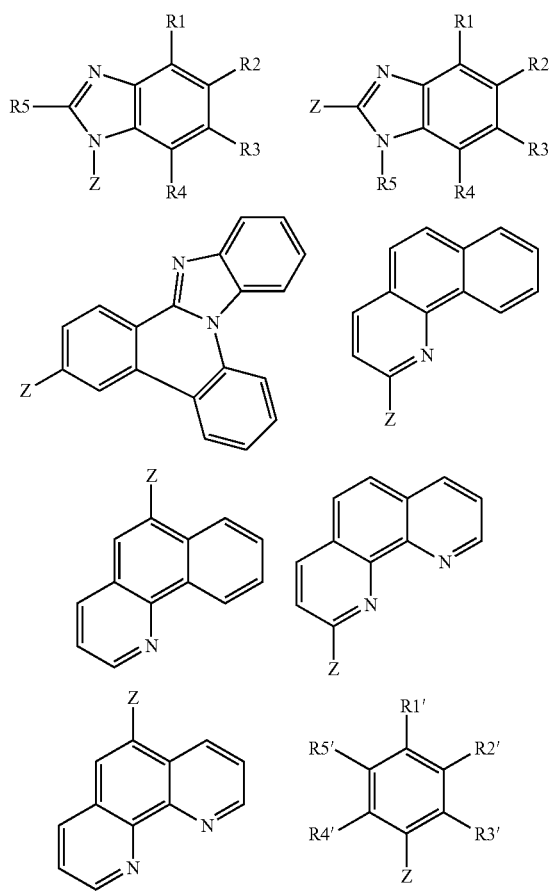

Z is a portion that links to a core, each of R1 to R5 is a group including an alkyl group or an electron-withdrawing atom, and each of R1' to R5' is a group including an electron-withdrawing atom.

27. The organic light emitting device of claim 1, wherein the first electron transport layer each independently includes one or more types selected from the compounds having the following structural formulae:

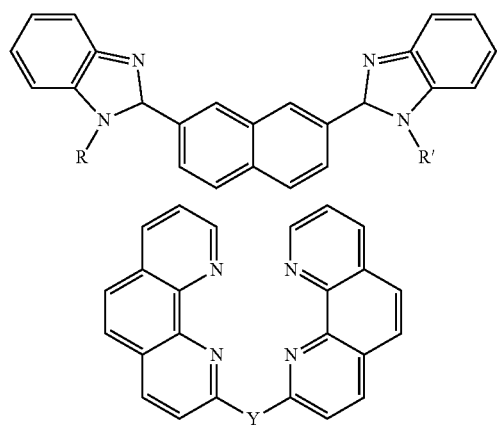

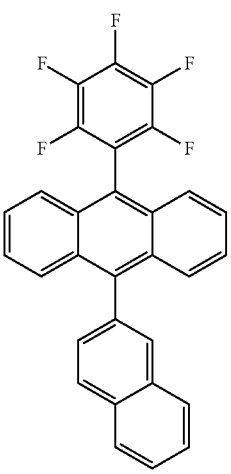

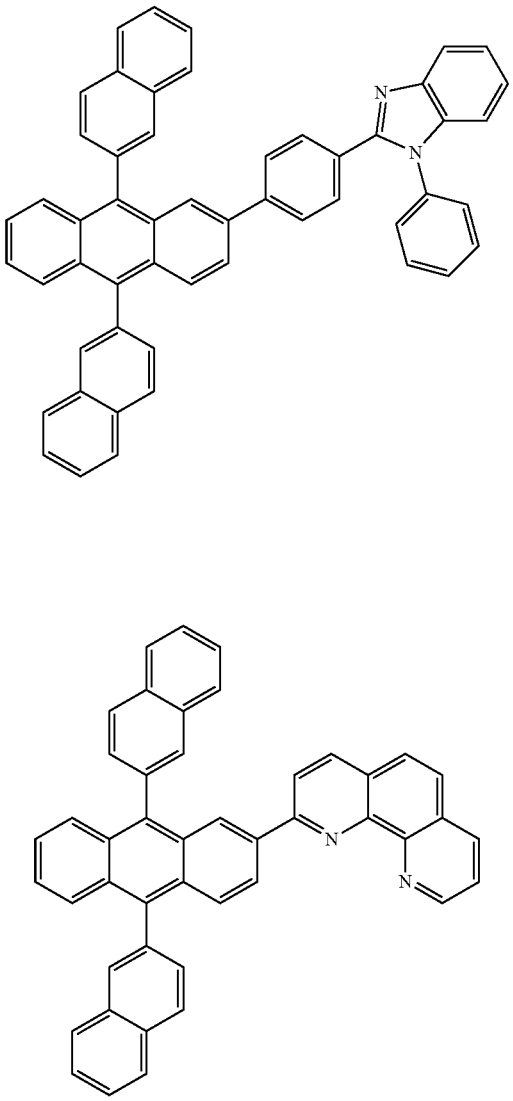

4
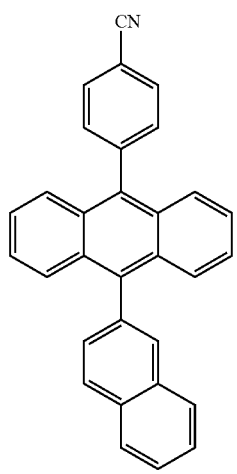
5
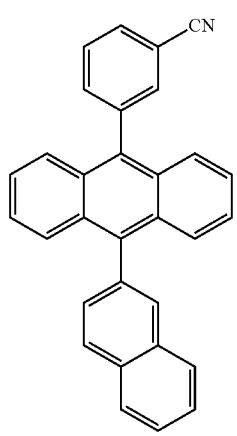
6
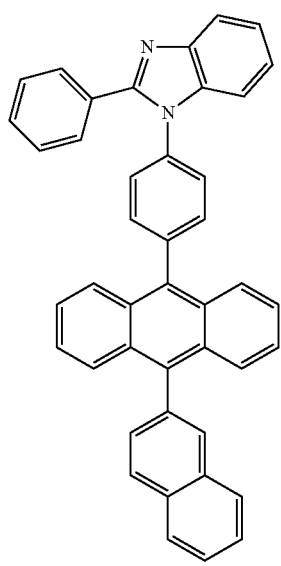
7
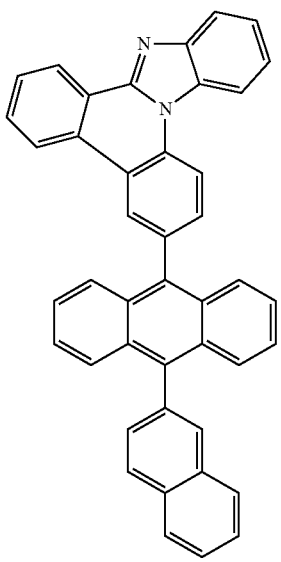
8
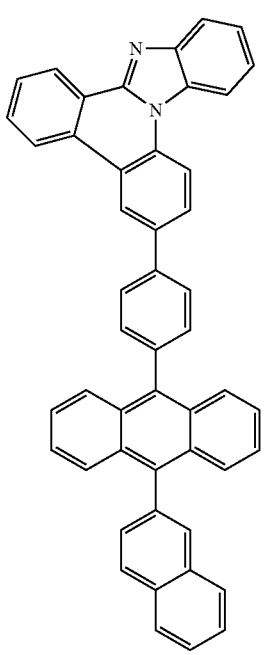

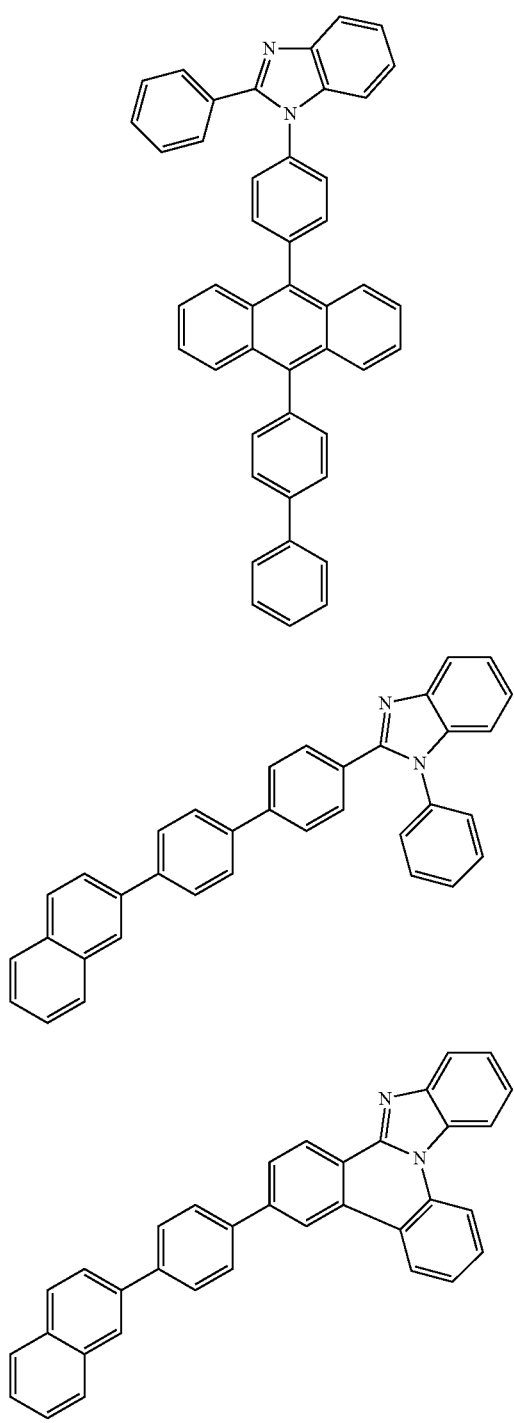

in the above formulae,
each of R and R' is a $C_1$-$C_{20}$ alkyl group or a $C_6$-$C_{20}$ aryl group, and
Y is an arylene group.

28. The organic light emitting device of claim 1, wherein the first electron transport layer each independently includes one or more types selected from the compounds having structural formulae of the following Group 1, and one or more types selected from the compounds having structural formulae of the following Group 2:

[Group 1]

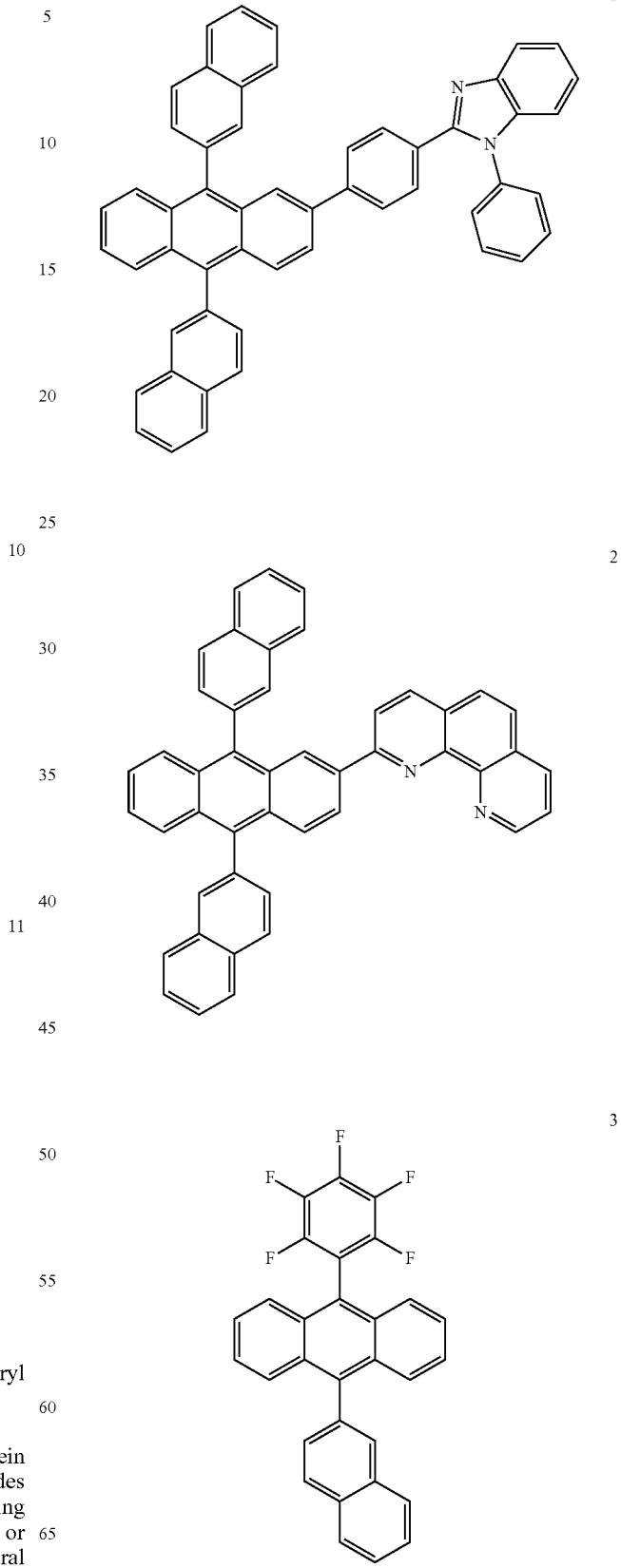

4
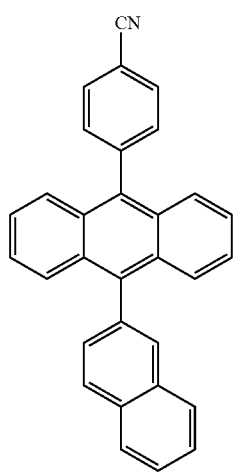
5
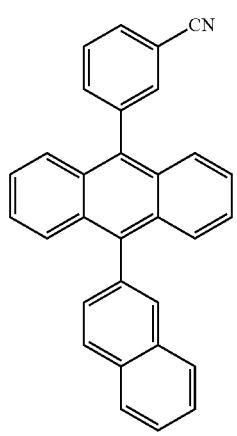
6
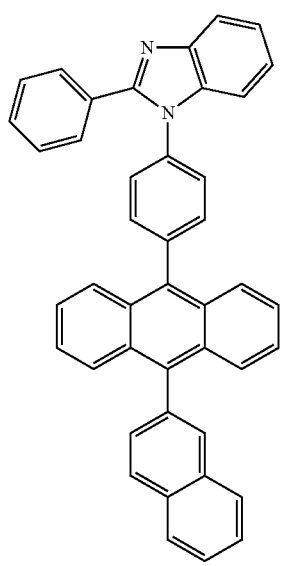
7
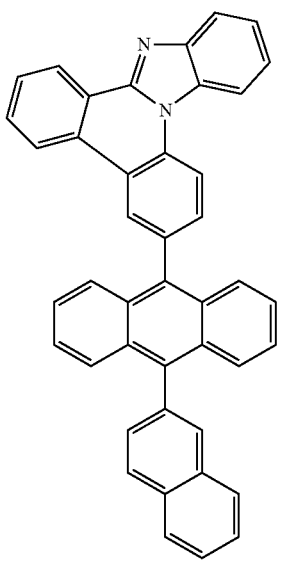
8
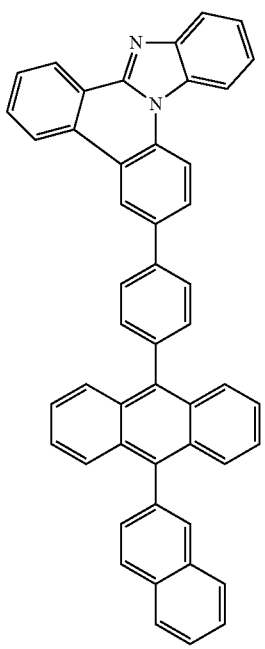

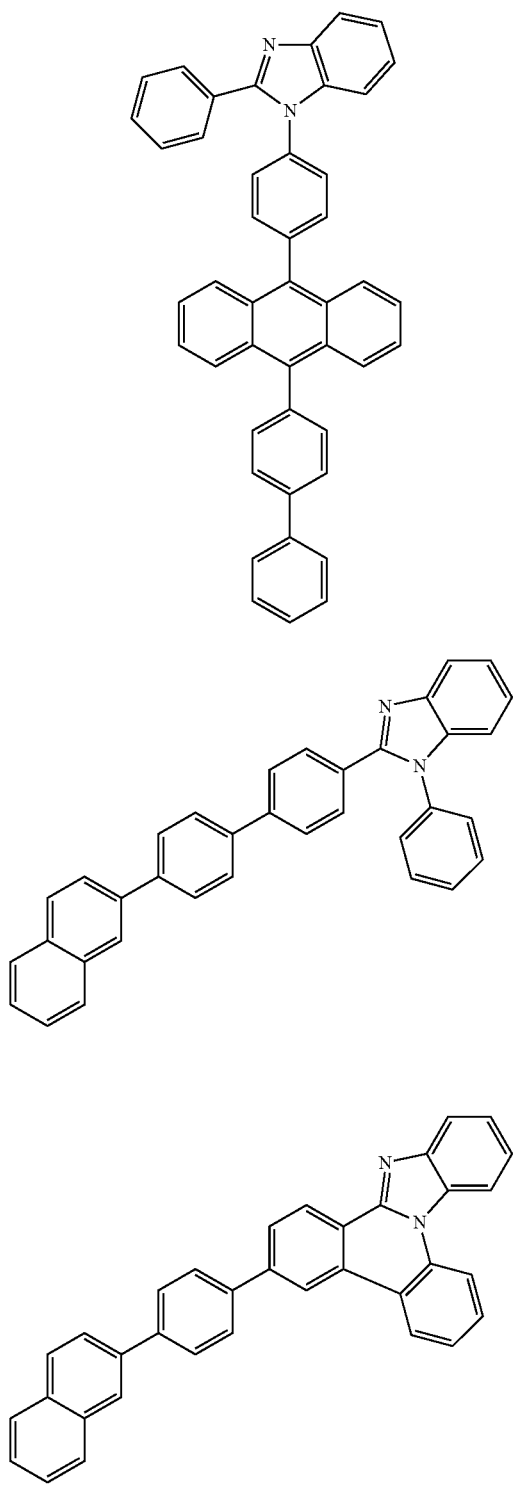

[Group 2]

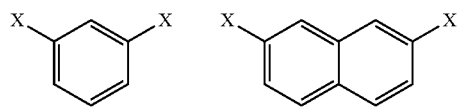

in the above formulae, X is represented by the following formulae,

Z is a portion that links to the above core structure, and each of R1 to R5 is a group including an alkyl group or an electron-withdrawing atom.

29. The organic light emitting device of claim 1, wherein the second electron transport layer each independently includes one or more types selected from the compounds having the following structural formulae:

1
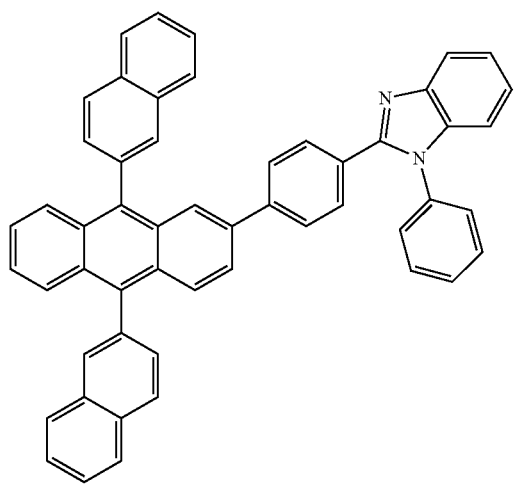
2
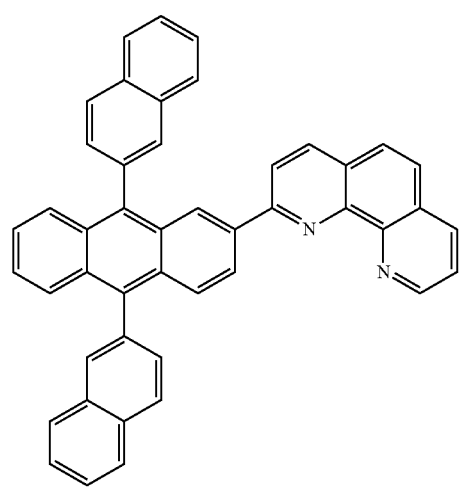
3
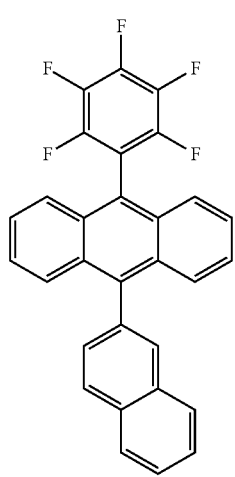
4
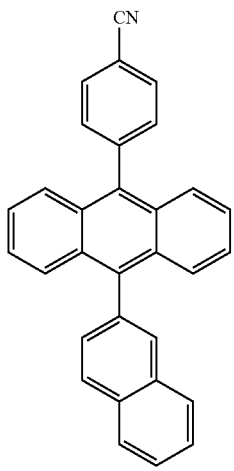
5
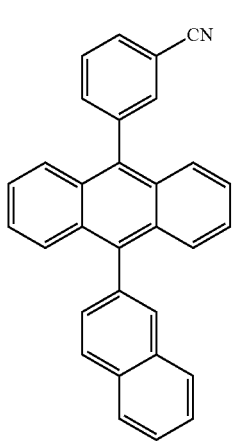
6
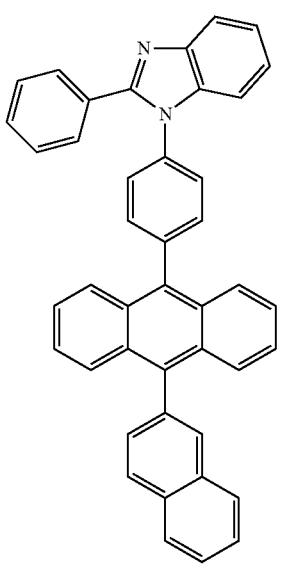

7
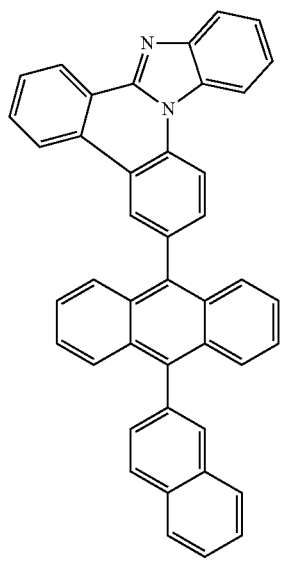
8
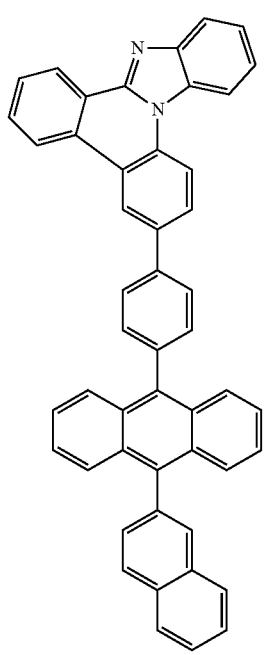
9
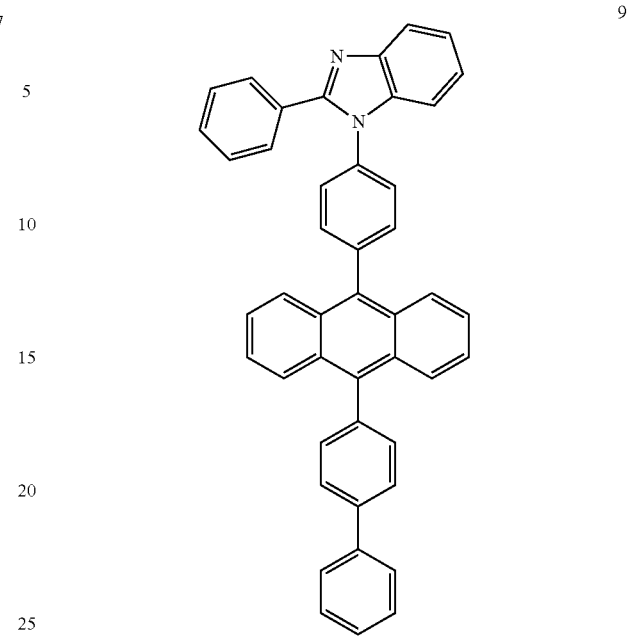
10
11
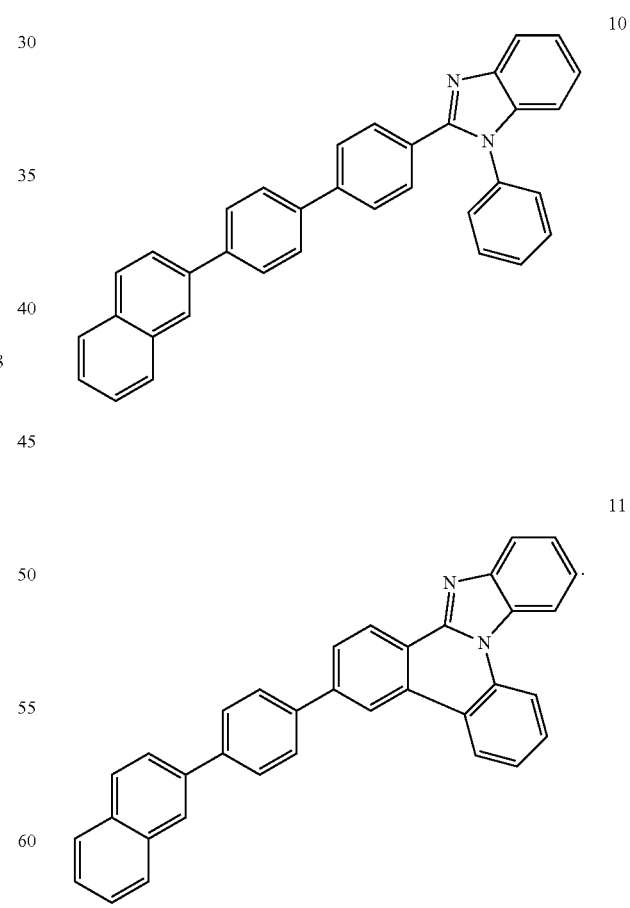
30. The organic light emitting device of claim 29, wherein the second electron transport layer includes an organic metal salt of the following Chemical Formula 3

[Chemical Formula 3]

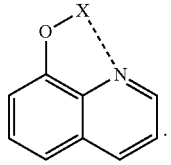

X = Li, Na, K

31. The organic light emitting device of claim 1, further comprising:
    a substrate on a surface opposite the surface on which the light emitting unit of the first electrode is provided; and
    a light scattering layer between the substrate and the first electrode, or on a surface opposite the surface on which the first electrode is provided.

32. The organic light emitting device of claim 1, wherein the organic light emitting device is a flexible organic light emitting device.

33. A display device including the organic light emitting device of claim 1.

34. An illumination device including the organic light emitting device of claim 1.

* * * * *